(12) United States Patent
Jang et al.

(10) Patent No.: US 12,273,127 B2
(45) Date of Patent: Apr. 8, 2025

(54) ERROR CORRECTION CODE DECODER, STORAGE CONTROLLER AND STORAGE DEVICE

(71) Applicant: Samsung Electronics Co., Ltd., Suwon-si (KR)

(72) Inventors: Jaehun Jang, Suwon-si (KR); Mankeun Seo, Suwon-si (KR); Hongrak Son, Suwon-si (KR); Bohwan Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 95 days.

(21) Appl. No.: 18/218,294

(22) Filed: Jul. 5, 2023

(65) Prior Publication Data
US 2024/0184669 A1    Jun. 6, 2024

(30) Foreign Application Priority Data
Dec. 5, 2022   (KR) .......................... 10-2022-0167363

(51) Int. Cl.
  *H03M 13/37*   (2006.01)
  *G06F 11/10*   (2006.01)
(52) U.S. Cl.
  CPC ... *H03M 13/3738* (2013.01); *H03M 13/3715* (2013.01); *G06F 11/1012* (2013.01); *G06F 11/1044* (2013.01)
(58) Field of Classification Search
  CPC .................. H03M 13/3738; H03M 13/3715
  See application file for complete search history.

(56) References Cited

U.S. PATENT DOCUMENTS

| | | | |
|---|---|---|---|
| 3,665,396 A * | 5/1972 | Forney, Jr. ............ | H03M 13/39 714/791 |
| 6,952,443 B1* | 10/2005 | Kong .................... | H04L 1/0046 375/225 |
| 8,229,039 B2 | 7/2012 | Shen et al. | |
| 8,443,267 B2 | 5/2013 | Zhong et al. | |
| 8,627,188 B2 | 1/2014 | Weingarten et al. | |
| 9,602,134 B2 | 3/2017 | Kim et al. | |
| 10,073,734 B2 | 9/2018 | Haratsch et al. | |
| 11,024,391 B1 | 6/2021 | Steiner et al. | |
| 2021/0359710 A1* | 11/2021 | Jo ............................ | G06F 1/04 |
| 2022/0182073 A1 | 6/2022 | Lee et al. | |

FOREIGN PATENT DOCUMENTS

CN          107924705 A  *   4/2018    ......... G06F 11/1048

* cited by examiner

*Primary Examiner* — Joseph D Torres
(74) *Attorney, Agent, or Firm* — Muir Patent Law, PLLC

(57) ABSTRACT

An Error correction code (ECC) decoder including an input manager configured to sequentially receive a first read data including a plurality of data units read from a plurality of sectors in a memory cell array of a nonvolatile memory device, by unit of sector, a pre-decoder configured to sequentially receive the first read data and generate a respective syndrome of each of the data units, and a main decoder configured to sequentially perform a first ECC decoding on the first read data based on the respective syndrome. The input manager includes a defective sector buffer to store a data unit having a minimum expected error count from among data units on which a first ECC decoding is failed. The main decoder performs a second ECC decoding on a defective data unit stored in the defective sector buffer and receives a second read data from a selected sector corresponding to the defective data unit.

20 Claims, 28 Drawing Sheets

| | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| LSB | 1 | 0 | 0 | 0 | 1 | 1 | 0 | 0 | 0 | 0 | 0 | 1 | 1 | 1 | 1 | 1 |
| ESB | 1 | 1 | 1 | 0 | 0 | 0 | 0 | 1 | 1 | 0 | 0 | 0 | 0 | 1 | 1 | 1 |
| USB | 1 | 1 | 1 | 1 | 1 | 0 | 0 | 0 | 0 | 0 | 1 | 1 | 0 | 0 | 0 | 1 |
| MSB | 1 | 1 | 0 | 0 | 0 | 0 | 0 | 0 | 1 | 1 | 1 | 1 | 1 | 1 | 0 | 0 |

$$S_{3 \times 5} = \begin{bmatrix} 2 & 3 & 110 & 142 & 165 \\ 5 & 64 & 96 & 113 & 144 \\ 7 & 50 & 75 & 116 & 174 \end{bmatrix}$$

ERROR CORRECTION CODE DECODER, STORAGE CONTROLLER AND STORAGE DEVICE

CROSS-REFERENCE TO RELATED APPLICATIONS

This US non-provisional application claims priority under 35 USC § 119 to Korean Patent Application No. 10-2022-0167363, filed on Dec. 5, 2022, in the Korean Intellectual Property Office (KIPO), the disclosure of which is incorporated herein in its entirety by reference.

BACKGROUND

1. Technical Field

Example embodiments generally relate to semiconductor integrated circuits, and more particularly to an error correction code (ECC) decoder, a storage controller including the same and a storage device including the same.

2. Discussion of the Related Art

Semiconductor memory devices are classified into a volatile memory and a nonvolatile memory.

The volatile memory may lose contents stored therein at power-off. The nonvolatile memory may retain stored contents even at power-off. A flash memory, one of the nonvolatile memory devices, may have following advantages: mass storage capability, relatively high noise immunity, and low power operation. Therefore, the flash memory devices are employed in various fields. For example, a mobile system such as a smart-phone, or a tablet PC employs flash memory as a storage medium.

As fabrication process of a flash memory device is scaled-down and memory cells of the flash memory device are stacked, the memory cells are degraded and data retention characteristic of the memory cells are degraded.

SUMMARY

Some example embodiments may provide an error correction code (ECC) decoder capable of reducing latency of soft-decision decoding.

Some example embodiments may provide a storage controller including an ECC decoder capable of reducing latency of soft-decision decoding.

Some example embodiments may provide a storage device including an ECC decoder capable of reducing latency of soft-decision decoding.

According to some example embodiments, an ECC decoder includes an input manager, a pre-decoder and a main decoder. The input manager sequentially receives a first read data including a plurality of data units read from a plurality of sectors in a memory cell array of a nonvolatile memory device, by unit of sector. The pre-decoder sequentially receives the first read data by unit of sector, in parallel with the input manager receiving the first read data and generates a respective syndrome of each of the plurality of data units sequentially. The main decoder sequentially performs a first ECC decoding on the first read data based on the respective syndrome, by unit of sector. The input manager includes a defective sector buffer, in response to the first ECC decoding on a first data unit of the plurality of data units being failed, stores the first data unit in the defective sector buffer and, in response to the first ECC decoding on a second data unit of the plurality of data units being failed, selectively stores the second data unit in the defective sector buffer based on an expected error count of each of the first data unit and the second data unit. The main decoder performs a second ECC decoding on a defective data unit stored in the defective sector buffer and receives a second read data from a selected sector corresponding to the defective data unit, from among the plurality of sectors.

According to some example embodiments, a storage controller configured to control a nonvolatile memory device includes an ECC decoder, a processor to control the ECC decoder. The ECC decoder sequentially receives a first read data including a plurality of data units read from a plurality of sectors in a memory cell array of a nonvolatile memory device, by unit of sector, sequentially performs a first ECC decoding on the first read data by unit of sector, in response to the first ECC decoding on a first data unit of the plurality of data units being failed, stores the first data unit in a defective sector buffer therein, in response to the first ECC decoding on a second data unit of the plurality of data units being failed, selectively stores the second data unit in the defective sector buffer based on an expected error count of each of the first data unit and the second data unit, and performs a second ECC decoding on a defective data unit stored in the defective sector buffer and receives a second read data from a selected sector corresponding to the defective data unit, from among the plurality of sectors.

According to some example embodiments, a storage device includes at least one nonvolatile memory device and a storage controller including an ECC decoder. The least one nonvolatile memory device includes a memory cell array, wherein the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks. The ECC decoder sequentially receives a first read data including a plurality of data units read from a plurality of sectors in the memory cell array based on a default read voltage, by unit of sector, sequentially performs a first ECC decoding on the first read data by unit of sector, in response to the first ECC decoding on a first data unit of the plurality of data units being failed, stores the first data unit in a defective sector buffer therein, in response to the first ECC decoding on a second data unit of the plurality of data units being failed, selectively stores the second data unit in the defective sector buffer based on an expected error count of each of the first data unit and the second data unit, and performs a second ECC decoding on a defective data unit stored in the defective sector buffer and a second read data read from a selected sector corresponding to the defective data unit, based on offset read voltages that have an offset with respect to the default read voltage, from among the plurality of sectors.

Accordingly, the ECC decoder performs a first ECC decoding on each of a plurality of data units, in response to the first ECC decoding on a portion of the plurality of data units being failed, stores a defective data unit having a minimum expected error count (i.e., a maximum probability associated with a success of a second ECC decoding) in a defective sector buffer located inside the ECC decoder, reads a second read data from a sector corresponding to the defective data unit, performs a second ECC decoding on the defective data unit and the second read data and corrects error in read data. Therefore, the ECC decoder may reduce latency associated with the second ECC decoding and may increase success probability of the second ECC decoding.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Various example embodiments will be described more fully hereinafter with reference to the accompanying drawings, in which some example embodiments are shown.

Figure 1:
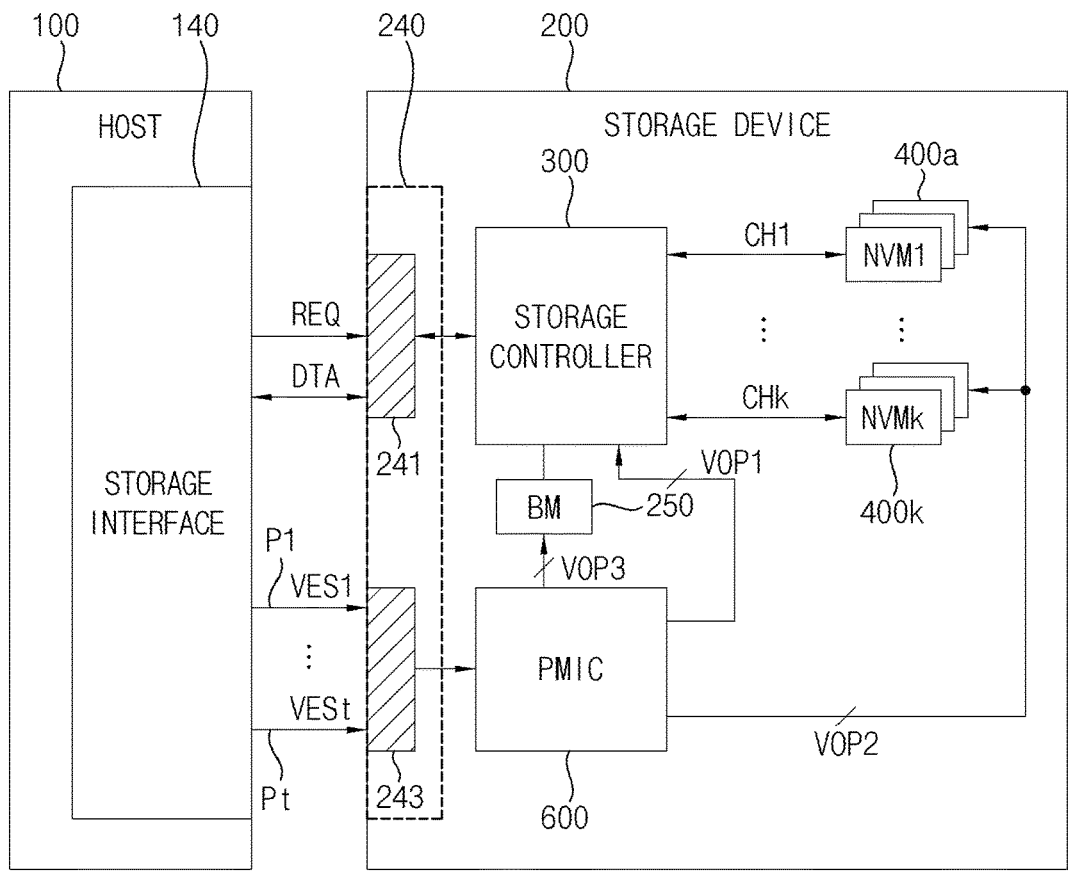
FIG. 1 is a block diagram illustrating a storage system according to example embodiments.

FIG. 1 is a block diagram illustrating a storage system according to example embodiments.

Referring to FIG. 1, a storage system 50 may include a host 100 and a storage device 200. The host 100 may include a storage interface 140.

The storage device 200 may be any kind of storage devices.

The storage device 200 may include a storage controller 300, a plurality of nonvolatile memory devices NVM1~NVMk 400a~400k (where k is an integer greater than two), a power management integrated circuit (PMIC) 600 and a host interface 240. The host interface 240 may include a signal connector 241 and a power connector 243. The storage device 200 may further include a buffer memory BM 250 that is implemented with a volatile memory device.

The plurality of nonvolatile memory devices 400a~400k may be used as a storage medium of the storage device 200. In some example embodiments, each of the plurality of nonvolatile memory devices 400a~400k may include a flash memory or a vertical NAND memory device. The storage controller 300 may be coupled to the plurality of nonvolatile memory devices 400a~400k through a plurality of channels CH1~CHk, respectively.

The storage controller 300 may be configured to receive a request REQ from the host 100 and communicate data DTA with the host 100 through the signal connector 241. The storage controller 300 may write data DTA to the plurality of nonvolatile memory devices 400a~400k or read the data DTA from the plurality of nonvolatile memory devices 400a~400k based on the request REQ.

The storage controller 300 may communicate the data DTA with the host 100 using the buffer memory 250 as an input/output buffer. In some example embodiments, the buffer memory 250 may include a dynamic random access memory (DRAM).

The PMIC 600 may be configured to receive a plurality of power supply voltages (i.e., external supply voltages) VES1-VESt from the host 100 through the power connector 243. For example, the power connector 243 may include a plurality of power lines P1~Pt, and the PMIC 600 may be configured to receive the plurality of power supply voltages VES1~VESt from the host 100 through the plurality of power lines P~Pt, respectively. Here, t represents a positive integer greater than one.

The PMIC 600 may generate at least one first operating voltage VOP1 used by the storage controller 300, at least one second operating voltage VOP2 used by the plurality of nonvolatile memory devices 400a~400k, and at least one third operating voltage VOP3 used by the buffer memory 250 based on the plurality of power supply voltages VES1~VESt.

For example, when the PMIC 600 receives all of the plurality of power supply voltages VES1~VESt from the host 100, the PMIC 600 may generate the at least one first operating voltage VOP1, the at least one second operating voltage VOP2, and the at least one third operating voltage VOP3 using all of the plurality of power supply voltages VES1~VESt. On the other hand, when the PMIC 600 receives less than all of the plurality of power supply voltages VES1~VESt from the host 100, the PMIC 600 may generate the at least one first operating voltage VOP1, the at least one second operating voltage VOP2, and the at least one third operating voltage VOP3 using all of the part of the plurality of power supply voltages VES1~VESt that is received from the host 100.

Figure 2:
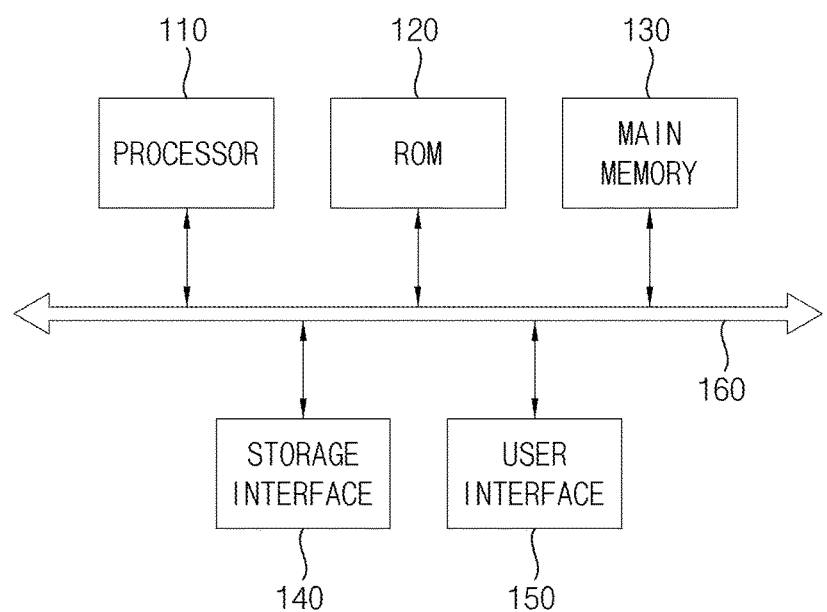
FIG. 2 is a block diagram illustrating an example of the host in FIG. 1 according to example embodiments.

FIG. 2 is a block diagram illustrating an example of the host in FIG. 1 according to example embodiments.

Referring to FIG. 2, the host 100 may include a processor 110, a read-only memory (ROM) 120, a main memory 130, a storage interface 140, a user interface 150 and a bus 160.

The bus 160 may refer to a transmission channel via which data is transmitted between the processor 110, the ROM 120, the main memory 130, the storage interface 140 and the user interface 150 of the host 100. The ROM 120 may store various application programs. For example, application programs supporting storage protocols such as Advanced Technology Attachment (ATA), Small Computer System Interface (SCSI), embedded Multi Media Card (eMMC), and/or Universal flash storage (UFS) protocols are stored.

The main memory 130 may temporarily store data or programs. The user interface 150 may be a physical or virtual medium for exchanging information between a user and the host device 100, a computer program, etc., and includes physical hardware and logical software. For example, the user interface 150 may include an input device for allowing the user to manipulate the host 100, and an output device for outputting a result of processing an input of the user.

The processor 110 may control overall operations of the host 100. The processor 110 may generate a command for storing data in the storage device 200 or a request (or a command) for reading data from the storage device 200 by using an application stored in the ROM 120, and may transmit the request to the storage device 200 via the storage interface 140. The processor 110 may generate plurality of power supply voltages VES1~VESt.

Figure 3:
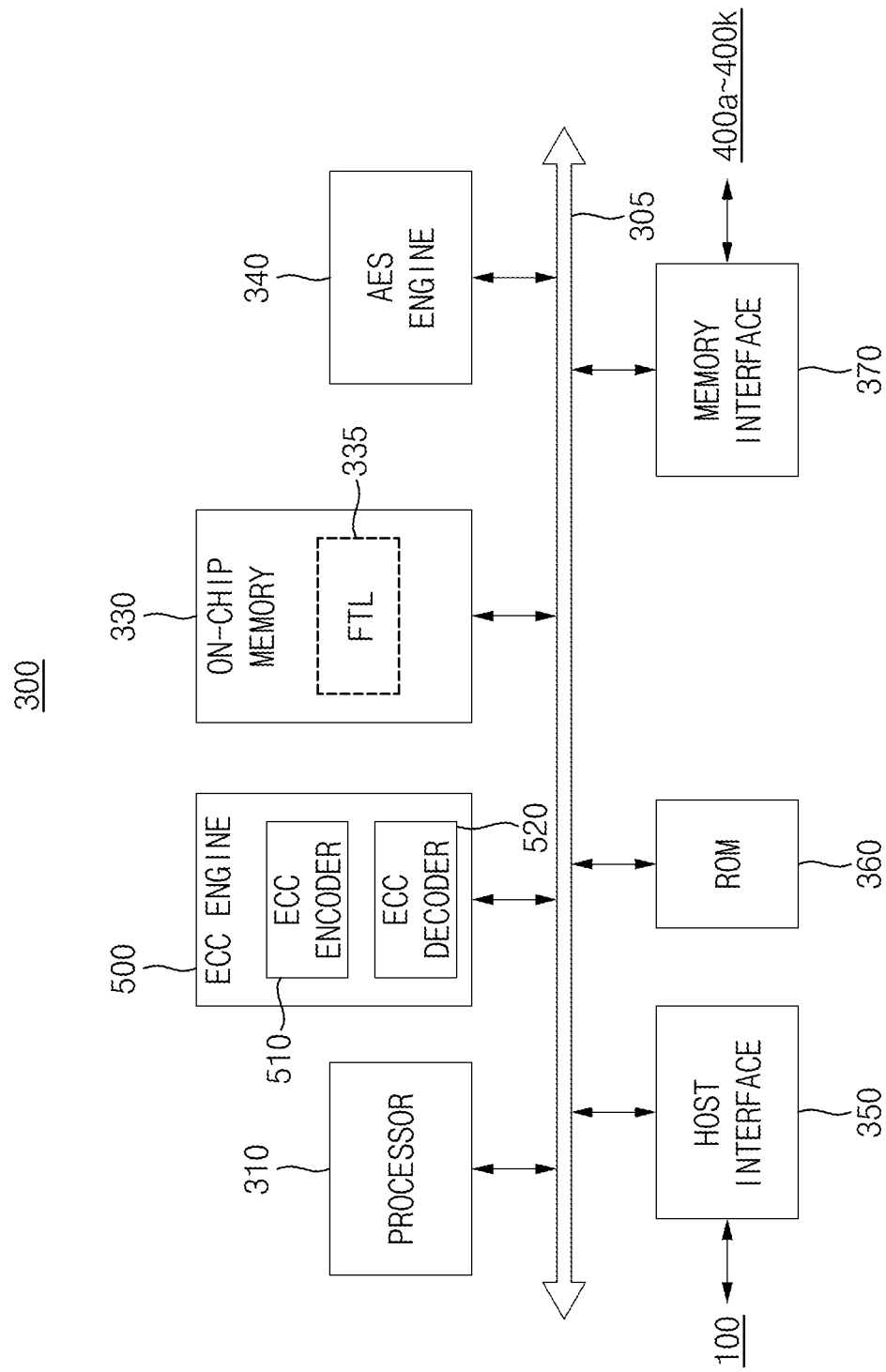
FIG. 3 is a block diagram illustrating an example of the storage controller in the storage device in FIG. 1 according to example embodiments.

FIG. 3 is a block diagram illustrating an example of the storage controller in the storage device in FIG. 1 according to example embodiments.

Referring to FIG. 3, the storage controller 300 may include a processor 310, an error correction code (ECC) engine 500, an on-chip memory 330, an advanced encryption standard (AES) engine 340, a host interface 350, a ROM 360 and a memory interface 370 which are connected via a bus 305.

The processor 310 controls an overall operation of the storage controller 300. The processor 310 may control the ECC engine 500, the on-chip memory 330, the AES engine 340, the host interface 350, the ROM 360 and the memory interface 370. The processor 310 may include one or more cores (e.g., a homogeneous multi-core or a heterogeneous multi-core). The processor 310 may be or include, for example, at least one of a central processing unit (CPU), an image signal processing unit (ISP), a digital signal processing unit (DSP), a graphics processing unit (GPU), a vision processing unit (VPU), and a neural processing unit (NPU). The processor 310 may execute various application programs (e.g., a flash translation layer (FTL) 335 and firmware) loaded onto the on-chip memory 330.

The on-chip memory 330 may store various application programs that are executable by the processor 310. The on-chip memory 330 may operate as a cache memory adjacent to the processor 310. The on-chip memory 330 may store a command, an address, and data to be processed by the processor 310 or may store a processing result of the processor 310. The on-chip memory 330 may be, for example, a storage medium or a working memory including a latch, a register, a static random access memory (SRAM), a dynamic random access memory (DRAM), a thyristor random access memory (TRAM), a tightly coupled memory (TCM), etc.

The processor 310 may execute the FTL 335 loaded onto the on-chip memory 330. The FTL 335 may be loaded onto the on-chip memory 330 as firmware or a program stored in the one of the nonvolatile memory devices 400a~400k. The FTL 335 may manage mapping between a logical address provided from the host 100 and a physical address of the nonvolatile memory devices 400a~400k and may include an address mapping table manager managing and updating an address mapping table. The FTL 335 may further perform a garbage collection operation, a wear leveling operation, and the like, as well as the address mapping described above. The FTL 335 may be executed by the processor 310 for addressing one or more of the following aspects of the nonvolatile memory devices 400a~400k: overwrite- or in-place write-impossible, a life time of a memory cell, a limited number of program-erase (PE) cycles, and an erase speed slower than a write speed.

Memory cells of the nonvolatile memory devices 400a~400k may have the physical characteristic that a threshold voltage distribution varies due to causes, such as a program elapsed time, a temperature, program disturbance, read disturbance and etc. For example, data stored at the nonvolatile memory devices 400a~400k becomes erroneous due to the above causes.

The storage controller 300 may utilize a variety of error correction techniques to correct such errors. For example, the storage controller 300 may include the ECC engine 500. The ECC engine 500 may correct errors which occur in the data stored in the nonvolatile memory devices 400a~400k. The ECC engine 500 may include an ECC encoder 510 and an ECC decoder 520. The ECC encoder 510 may perform an ECC encoding operation on data to be stored in the nonvolatile memory devices 400a~400k. The ECC decoder 520 may perform an ECC decoding operation on data read from the nonvolatile memory devices 400a~400k.

The ECC decoder 520 may receive a first read data including a plurality of data units read from a plurality of sectors in a memory cell array of at least one of the nonvolatile memory devices 400a~400k, sequentially by unit of sector, may perform a first ECC decoding on the first read data sequentially by unit of sector, in response to the first ECC decoding on a first data unit of the plurality of data units being failed, may store the first data unit in a defective sector buffer therein, in response to the first ECC decoding on a second data unit of the plurality of data units being failed, may selectively store the second data unit in the defective sector buffer based on an expected error count of each of the first data unit and the second data unit, and may perform a second ECC decoding on a defective data unit stored in the defective sector buffer and a second read data read from a selected sector corresponding to the defective data unit, from among the plurality of sectors.

The ROM 360 may store a variety of information, needed for the storage controller 300 to operate, in firmware.

The AES engine 340 may perform at least one of an encryption operation and a decryption operation on data input to the storage controller 300 by using a symmetric-key algorithm. Although not illustrated in detail, the AES engine 340 may include an encryption module and a decryption module. For example, the encryption module and the decryption module may be implemented as separate modules. For another example, one module capable of performing both encryption and decryption operations may be implemented in the AES engine 340.

The storage controller 300 may communicate with the host 100 through the host interface 350. For example, the host interface 350 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The storage controller 300 may communicate with the nonvolatile memory devices 400a~400k through the memory interface 370.

Figure 4:
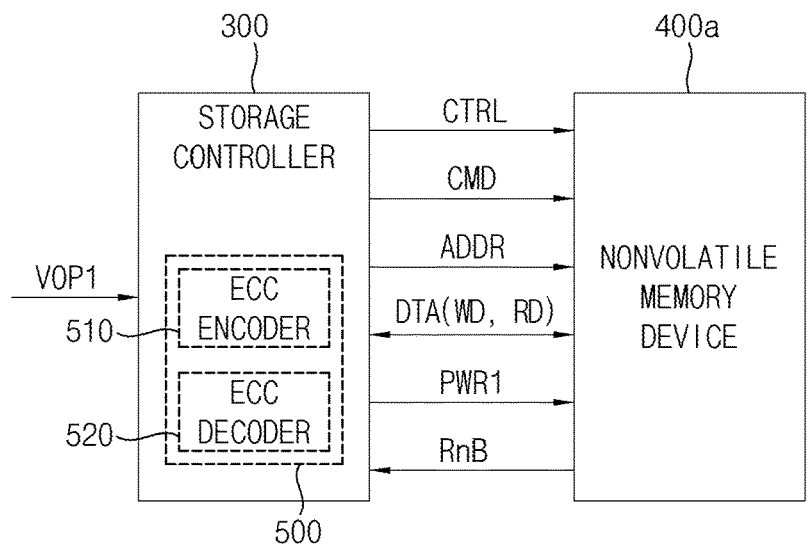
FIG. 4 is a block diagram illustrating a connection relationship between the storage controller and one nonvolatile memory device in the storage device of FIG. 1.

FIG. 4 is a block diagram illustrating a connection relationship between the storage controller and one nonvolatile memory device in the storage device of FIG. 1.

Referring to FIG. 4, the storage controller 300 may operate based on the first operating voltage VOP1.

The nonvolatile memory device 400a may perform an erase operation, a program operation, and/or a write operation under control of the storage controller 300. The nonvolatile memory device 400a may receive a command CMD, an address ADDR, and (user) data DTA (i.e., a write data WD) through input/output lines from the storage controller 300 for performing such operations. In addition, the nonvolatile memory device 400a may receive a control signal CTRL through a control line and receives a power PWR1 through a power line from the storage controller 300. In addition, the nonvolatile memory device 400a may provide the storage controller 300 with the data DTA (i.e., a read data RD).

The storage controller 300 may include the ECC engine 500, and the ECC engine 500 may include the ECC encoder 510 and the ECC decoder 520. The ECC encoder 510 may perform an ECC encoding operation on data to be stored in the nonvolatile memory device 400a. The ECC decoder 520 may perform an ECC decoding operation on data read from the nonvolatile memory device 400a.

The ECC decoder 520 may receive a first read data including a plurality of data units read from a plurality of sectors in a memory cell array of the nonvolatile memory device 400a, sequentially by unit of sector, may perform a first ECC decoding on the first read data sequentially by unit of sector, in response to the first ECC decoding on a first data unit of the plurality of data units being failed, may store the first data unit in a defective sector buffer therein, in response to the first ECC decoding on a second data unit of the plurality of data units being failed, may selectively store the second data unit in the defective sector buffer based on an expected error count of each of the first data unit and the second data unit, and may perform a second ECC decoding on a defective data unit stored in the defective sector buffer and a second read data read from a selected sector corresponding to the defective data unit, from among the plurality of sectors.

Figure 5:
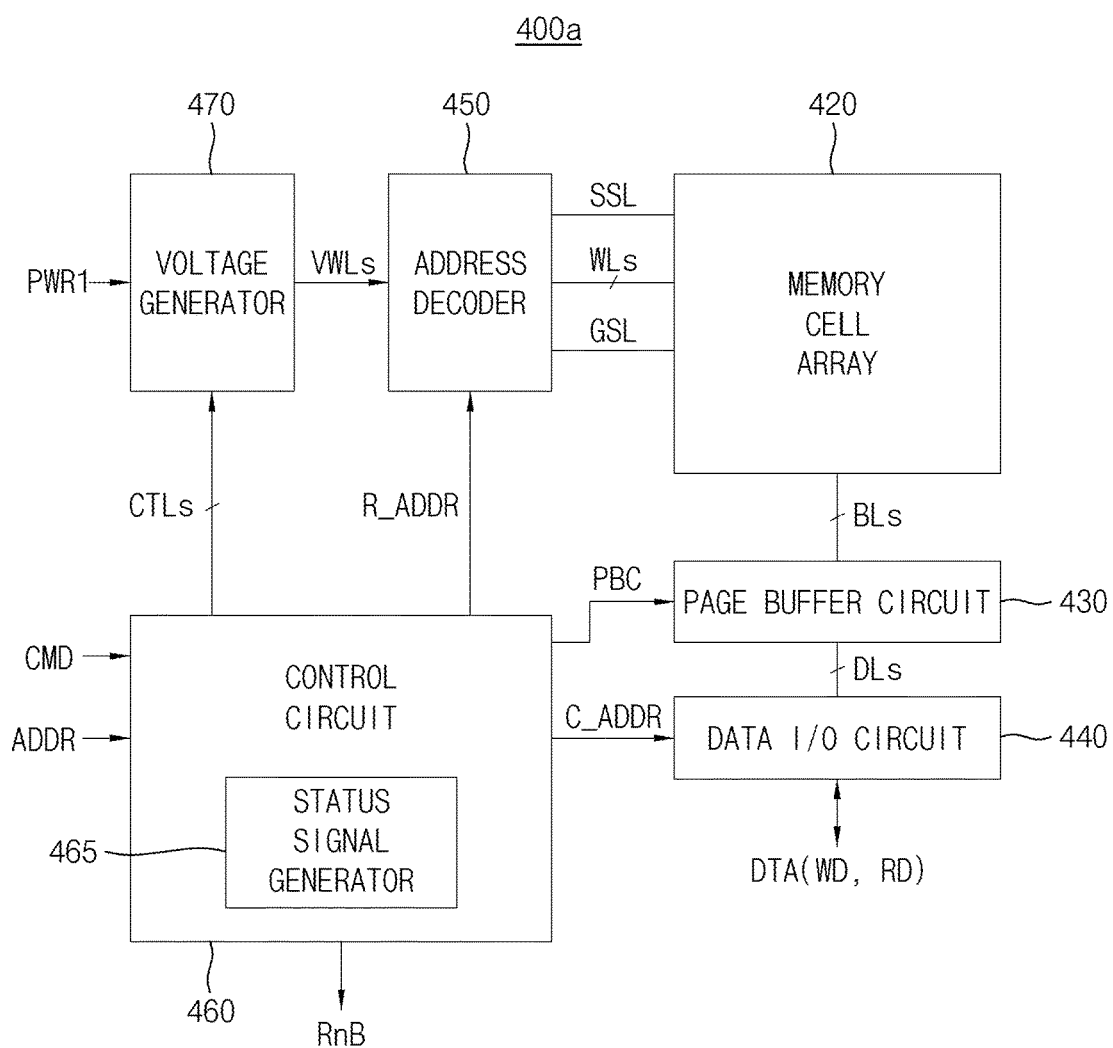
FIG. 5 is a block diagram illustrating an example of the nonvolatile memory device in FIG. 4 according to some example embodiments.

FIG. 5 is a block diagram illustrating an example of the nonvolatile memory device in FIG. 4 according to some example embodiments.

Referring to FIG. 5, the nonvolatile memory device 400a may include a memory cell array 420, an address decoder 450, a page buffer circuit 430, a data input/output (I/O) circuit 440, a control circuit 460, and a voltage generator 470.

The memory cell array 420 may be coupled to the address decoder 450 through a string selection line SSL, a plurality of word-lines WLs, and a ground selection line GSL. In addition, the memory cell array 420 may be coupled to the page buffer circuit 430 through a plurality of bit-lines BLs.

The memory cell array 420 may include a plurality of memory cells coupled to the plurality of word-lines WLs and the plurality of bit-lines BLs.

In some example embodiments, the memory cell array 420 may be or include a three-dimensional memory cell array, which is formed on a substrate in a three-dimensional structure (e.g., a vertical structure). In this case, the memory cell array 420 may include (vertical) cell strings that are vertically oriented such that at least one memory cell is located over another memory cell.

Figure 6:
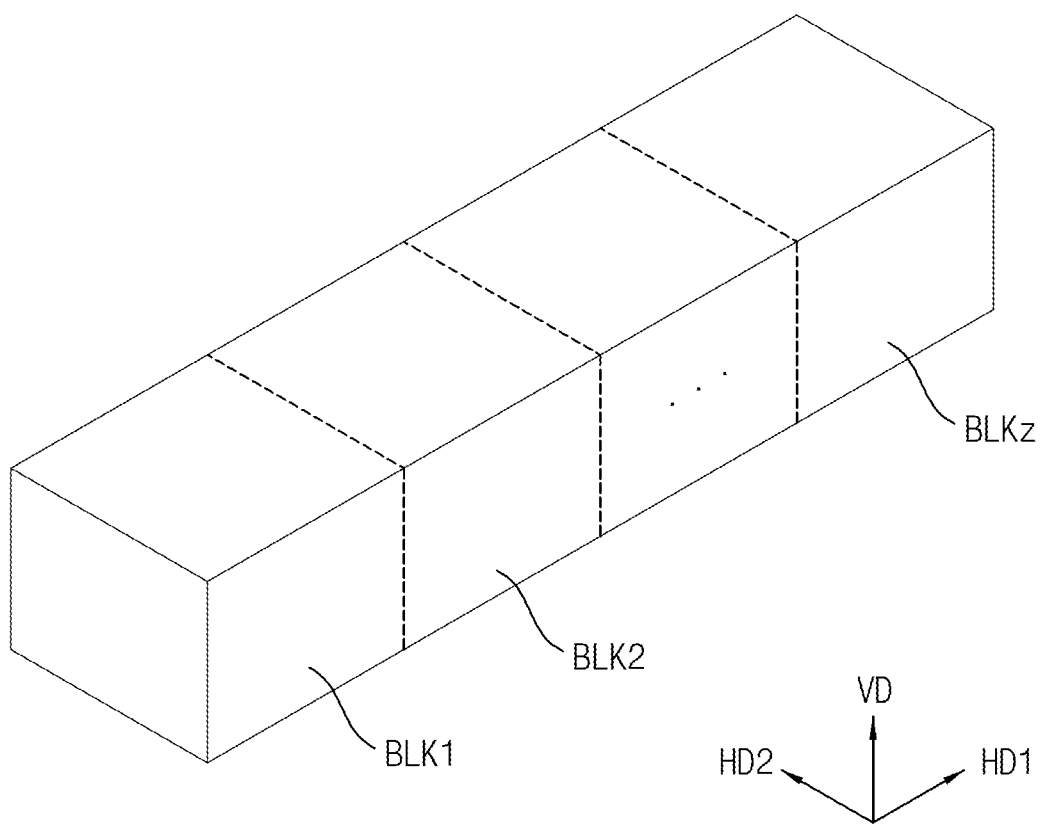
FIG. 6 is a block diagram illustrating an example of the memory cell array in the nonvolatile memory device of FIG. 5.

FIG. 6 is a block diagram illustrating an example of the memory cell array in the nonvolatile memory device of FIG. 5.

Referring to FIG. 6, the memory cell array 420 may include a plurality of memory blocks BLK1, BLK2 to BLKz. The memory blocks BLK1, BLK2 to BLKz extend along a first horizontal direction HD1, a second horizontal direction HD2 and a vertical direction VD. Here, z is a natural number greater than two. In some example embodiments, the memory blocks BLK1, BLK2 to BLKz are selected by the address decoder 450 in FIG. 5. For example, the address decoder 450 may select a memory block BLK corresponding to a block address among the memory blocks BLK1, BLK2 to BLKz.

Figure 7:
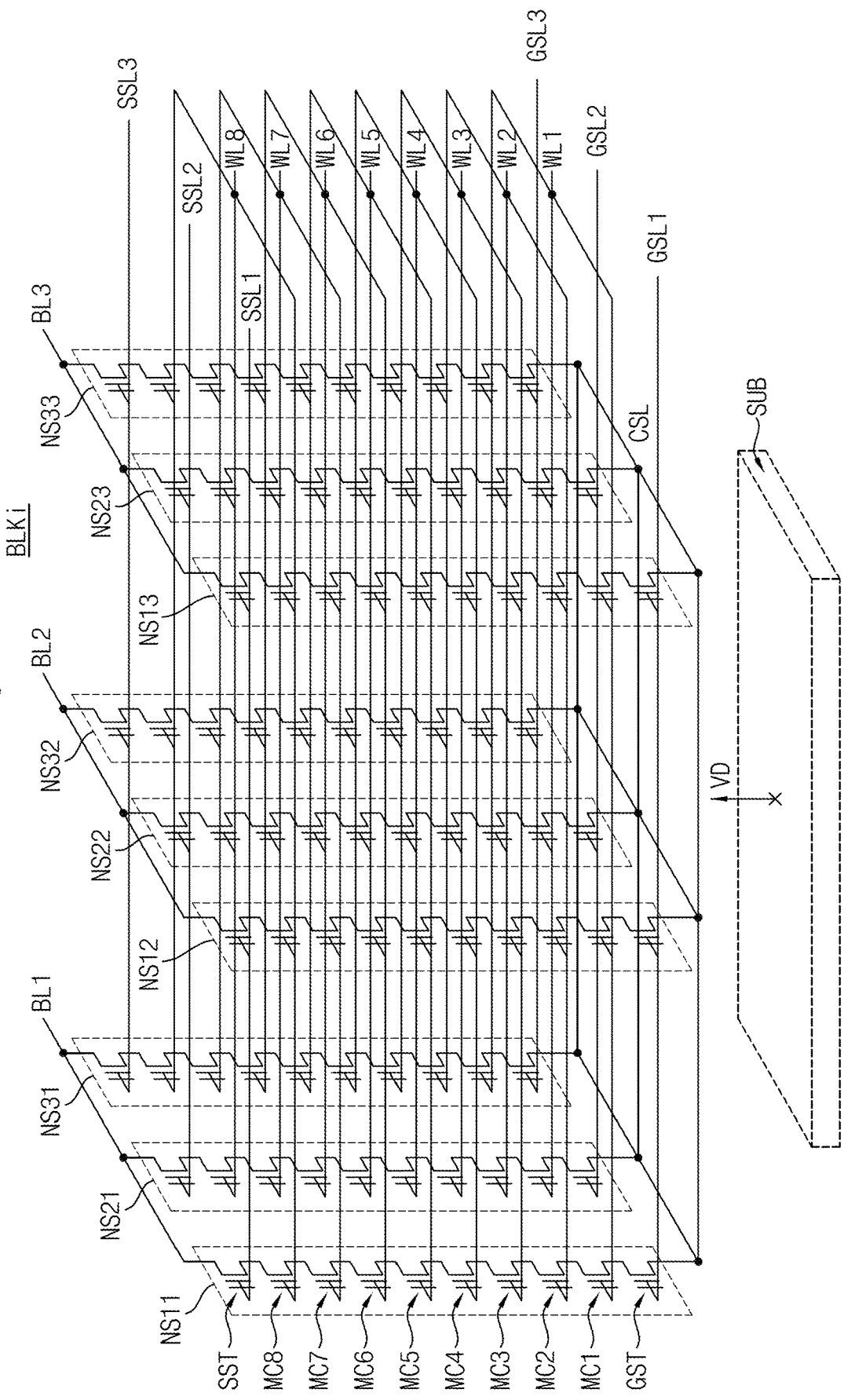
FIG. 7 is a circuit diagram illustrating one of the memory blocks of FIG. 6.

FIG. 7 is a circuit diagram illustrating one of the memory blocks of FIG. 6.

The memory block BLKi of FIG. 7 may be formed on a substrate SUB in a three-dimensional structure (or a vertical structure). For example, a plurality of memory cell strings included in the memory block BLKi may be formed in a vertical direction VD perpendicular to the substrate SUB.

Referring to FIG. 7, the memory block BLKi may include a plurality of cell strings NS11, NS21, NS31, NS12, NS22, NS32, NS13, NS23 and NS33 (herein, represented as NS11 to NS33) coupled between bit-lines BL1, BL2 and BL3 and a common source line CSL. Each of the memory cell strings NS11 to NS33 may include a string selection transistor SST, a plurality of memory cells MC1, MC2, MC3, MC4, MC5, MC6, MC7 and MC8 (herein, represented as MC1 to MC8), and a ground selection transistor GST. In FIG. 7, each of the memory cell strings NS11 to NS33 is illustrated to include eight memory cells MC1 to MC8. However, the present disclosure is not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 7, the memory block BLKi is illustrated to be coupled to eight word-lines WL1 to WL8 and three bit-lines BL1 to BL3. However, the present disclosure is not limited thereto. In some example embodiments, the memory cell array 420 may be coupled to any number of word-lines and bit-lines.

Figure 8:
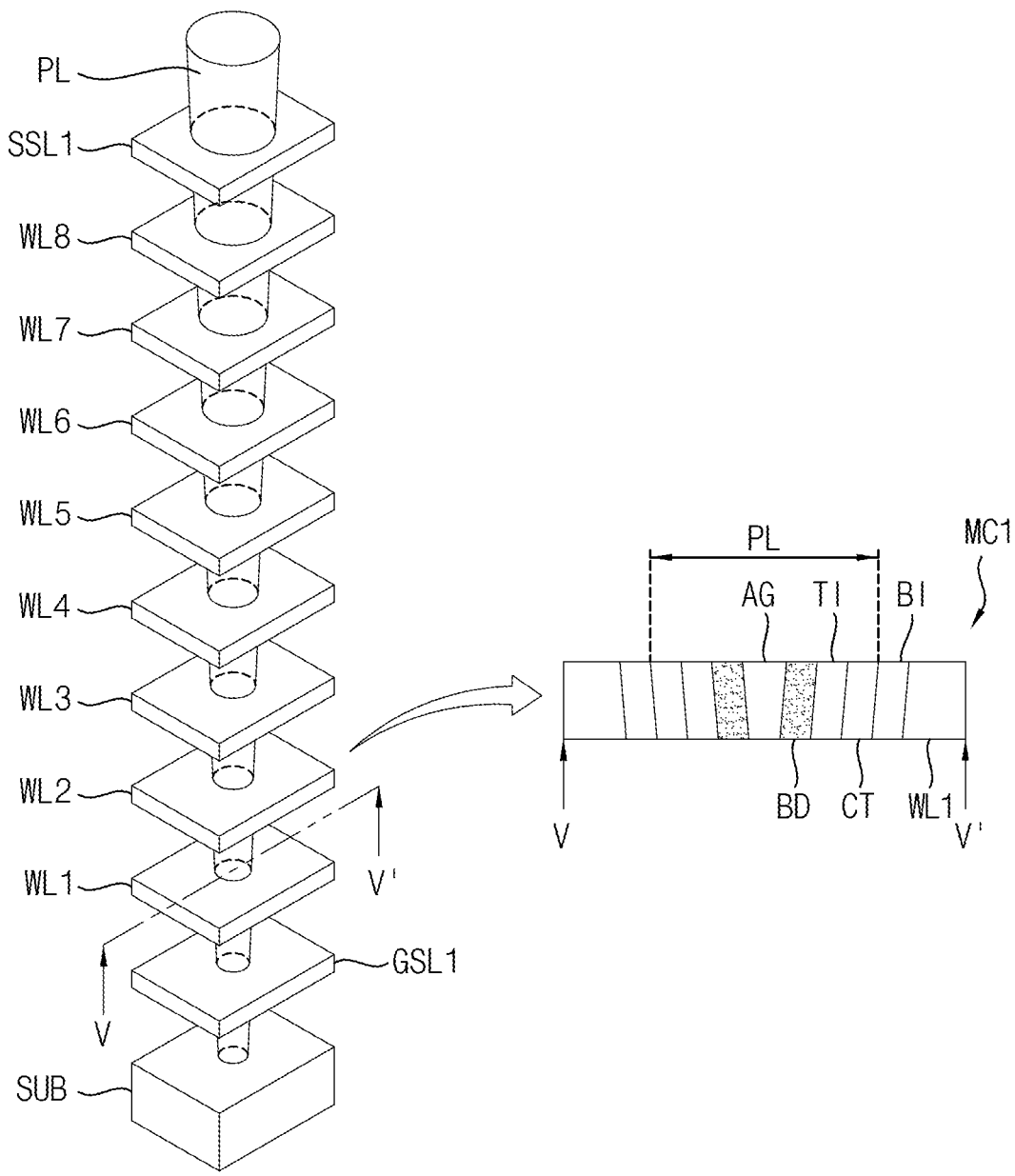
FIG. 8 illustrates an example of a structure of a cell string in the memory block of FIG. 7.

FIG. 8 illustrates an example of a structure of a cell string NS11 in the memory block of FIG. 7.

Referring to FIGS. 7 and 8, a pillar PL is provided on the substrate SUB such that the pillar PL extends in a direction perpendicular to the substrate SUB to make contact with the substrate SUB. Each of the ground selection line GSL1, the word lines WL1 to WL8, and the string selection line SSL1 illustrated in FIG. 8 may be formed of a conductive material parallel with the substrate SUB, for example, a metallic material. The pillar PL may be in contact with the substrate SUB through the conductive materials forming the string selection lines SSL1, the word lines WL1 to WL8, and the ground selection line GSL1.

A sectional view taken along a line V-V' is also illustrated in FIG. 8. In some example embodiments, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 5, the control circuit 460 may receive the command (signal) CMD and the address (signal) ADDR from the storage controller 300, and may control an erase loop, a program loop and/or a read operation of the nonvolatile memory device 400a based on the command signal CMD and the address signal ADDR. The program loop may include a program operation and a program verification operation. The erase loop may include an erase operation and an erase verification operation.

For example, the control circuit 460 may generate control signals CTLs, which are used for controlling the voltage generator 470, may generate a page buffer control signal PBC for controlling the page buffer circuit 430 based on the command signal CMD, may provide the control signals CTLs to the voltage generator 470 and may provide the page buffer control signal PBC to the page buffer circuit 430. In addition, the control circuit 460 may generate a row address R_ADDR and a column address C_ADDR based on the address signal ADDR. The control circuit 460 may provide the row address R_ADDR to the address decoder 450 and may provide the column address C_ADDR to the data I/O circuit 440.

The address decoder 450 may be coupled to the memory cell array 420 through the string selection line SSL, the plurality of word-lines WLs, and the ground selection line GSL. During the program operation or the read operation, the address decoder 450 may determine one of the plurality of word-lines WLs as a first word-line (e.g., a selected word-line) and determine the rest of the plurality of word-lines WLs, except for the first word-line, as unselected word-lines based on the row address R_ADDR.

The voltage generator 470 may generate word-line voltages VWLs, which are required for the operation of the nonvolatile memory device 400a, based on the control signals CTLs. The voltage generator 470 may receive the power PWR1 from the storage controller 300. The word-line voltages VWLs may be applied to the plurality of word-lines WLs through the address decoder 450.

For example, during the erase operation, the voltage generator 470 may apply an erase voltage to a well of the memory block and may apply a ground voltage to entire word-lines of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the first word-line and may apply a program pass voltage to the unselected word-lines. In addition, during the program verification operation, the voltage generator 470 may apply a program verification voltage to the first word-line and may apply a verification pass voltage to the unselected word-lines.

Furthermore, during the read operation, the voltage generator 470 may apply a read voltage to the first word-line and may apply a read pass voltage to the unselected word-lines.

The page buffer circuit 430 may be coupled to the memory cell array 420 through the plurality of bit-lines BLs. The page buffer circuit 430 may include a plurality of page buffers. In some example embodiments, one page buffer may be connected to one bit-line. In some example embodiments, one page buffer may be connected to two or more bit-lines.

The page buffer circuit 430 may temporarily store data to be programmed in a selected page or data read out from the selected page.

The data I/O circuit 440 may be coupled to the page buffer circuit 430 through data lines DLs. During the program operation, the data input/output circuit 440 may receive the data DTA (or, the write data WD) from the storage controller 300 and provide the data DTA to the page buffer circuit 430 based on the column address C_ADDR received from the control circuit 460.

During the read operation, the data I/O circuit 440 may provide the data DTA (or, the read data RD) which are stored in the page buffer circuit 430, to the storage controller 300 based on the column address C_ADDR received from the control circuit 460.

The control circuit 460 may control the page buffer circuit 430 and data I/O circuit 440.

The control circuit 460 may include a status signal generator 465 and the status signal generator 465 may generate a status signal RnB indicating whether each of the program operation, the erase operation and the read operation is completed and/or is in progress.

The storage controller 300 may determine idle state or busy state of each of the nonvolatile memory devices 400a~400k based on the status signal RnB.

Figure 9:
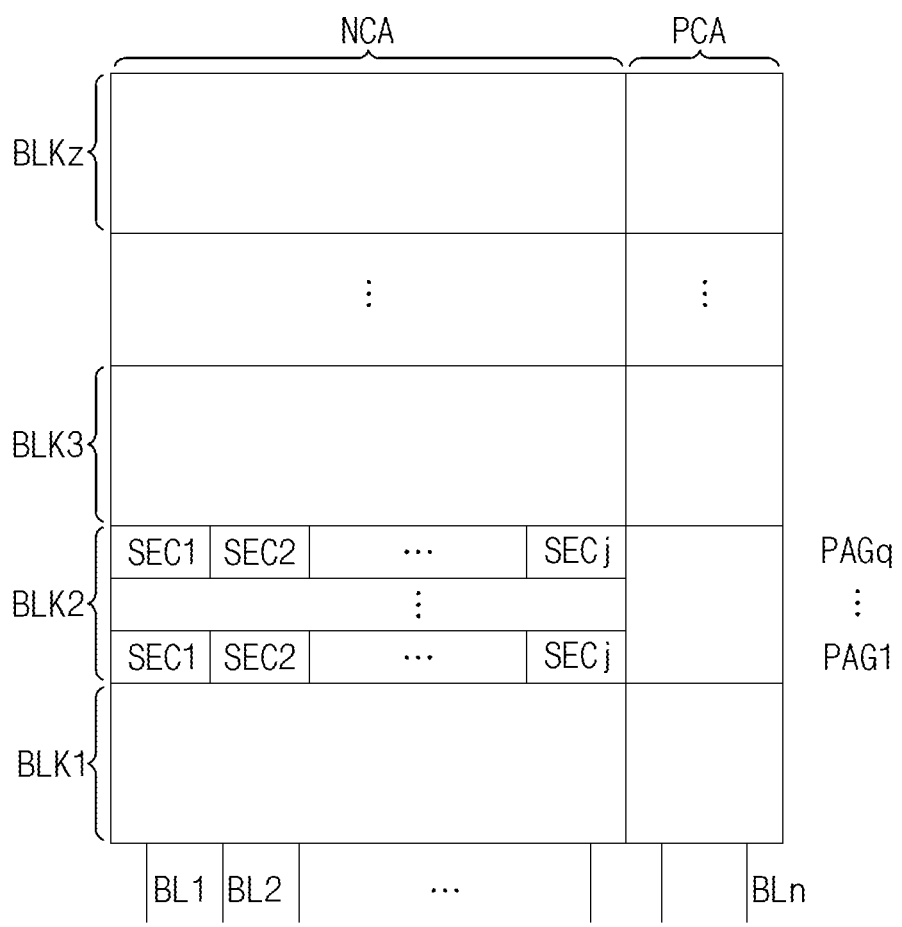
FIG. 9 is a block diagram illustrating an example of the memory cell array in the nonvolatile memory device of FIG. 5 according to example embodiments.

FIG. 9 is a block diagram illustrating an example of the memory cell array in the nonvolatile memory device of FIG. 5 according to example embodiments.

Referring to FIG. 9, the memory cell array 420 may include a plurality of memory blocks BLK1~BLKz. Each of the plurality of memory blocks BLK1~BLKz may include a plurality of pages PAG1~PAGq (q is an integer equal to or greater than 2).

The memory cell array 420 may include a normal cell region NCA to store the user data DTA and a parity cell region PCA to store parity bits.

Memory cells of the normal cell region NCA and the parity cell region PCA may be coupled to bit-lines BL1~BLn (n is an integer equal to or greater than 4). Each of the pages in the normal cell region NCA and the parity cell region PCA may include a plurality of sectors SEC1, SEC2 to SECj (j is an integer equal to or greater than 3).

Figure 10:
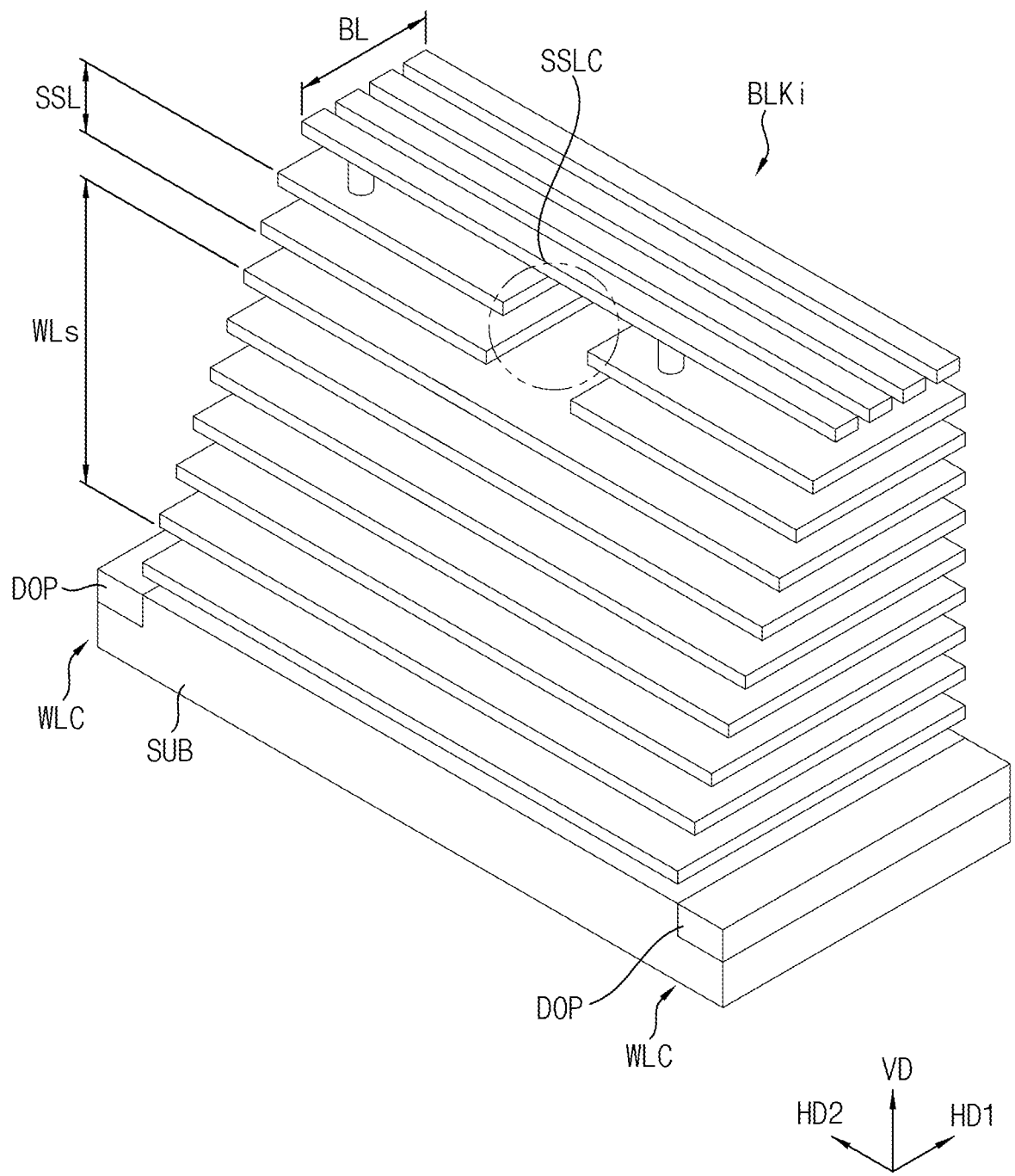
FIG. 10 is a perspective view illustrating one of the memory blocks in FIG. 6.

FIG. 10 is a perspective view illustrating one of the memory blocks in FIG. 6.

Referring to FIG. 10, the memory block BLKi may be implemented such that at least one ground selection line GSL, a plurality of word-lines WLs and at least one string selection line SSL are stacked on a substrate between word-line cut regions WLC. Doping regions DOP may be formed in top portions of the substrate of the word-line cut regions WLC. The doping region may be used as common source lines CSL or common source nodes CSN to which a common source voltage is applied. The at least one string selection line SSL may be divided by a string selection line cut region SSLC extending in the first horizontal direction HD1.

A plurality of vertical channels or channel holes penetrate the at least one ground selection lines GSL, the plurality of word-lines WLs and the at least one string selection lines SSL. The at least one ground selection lines GSL, the plurality of word-lines WL and the at least one string selection lines SSL may be formed in the shape of planks. Bit-lines BL are connected to top surfaces of the channel holes.

Figure 11A:
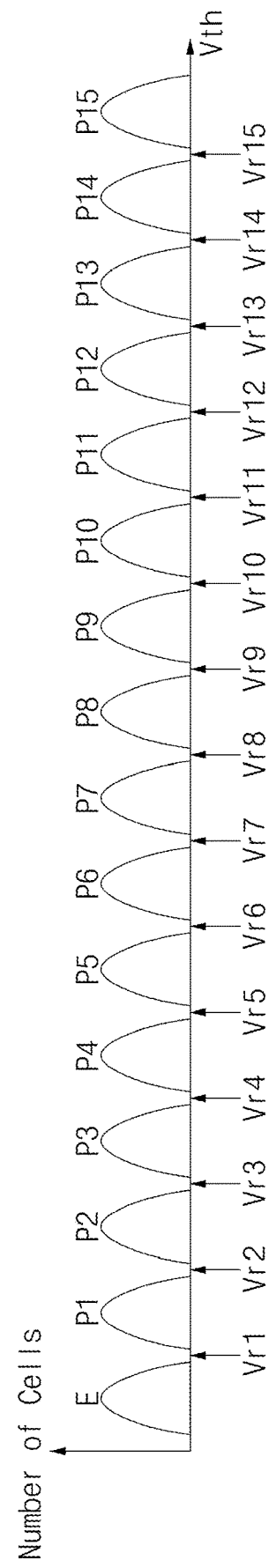
FIG. 11A is a graph showing a threshold voltage distribution of memory cells when a memory cell included in the memory cell array in FIG. 5 is a 4-bit quadrature level cell (QLC).

FIG. 11A is a graph showing a threshold voltage distribution of memory cells when a memory cell included in the memory cell array in FIG. 5 is a 4-bit quadrature level cell (QLC).

Referring to FIG. 13A, a horizontal axis represents a threshold voltage Vth and the vertical axis represents the number of memory cells. When each of the memory cells is a 4-bit quadrature level cell programmed to store 4 bits, the memory cell may have one from among an erase state E and first through fifteenth program states P1 through P15. When a memory cell is a multi-level cell, unlike a single-level cell, since an interval between threshold voltages distributions is small, a small change in the threshold voltage Vth may cause a big problem.

A first read voltage Vr1 has a voltage level between a distribution of a memory cell having the erase state E and a distribution of a memory cell having the first program state P1. Each of second through fifteenth read voltages Vr2 through Vr15 have a voltage level between distributions of memory cells having adjacent program states.

In example embodiments, assuming that the first read voltage Vr1 is applied, when a memory cell is turned on, data '1' may be stored, and when the memory cell is turned off, data '0' may be stored. However, the present disclosure is not limited thereto, and other example embodiments, assuming that the first read voltage Vr1 is applied, when a memory cell is turned on, data '0' may be stored, and when the memory cell is turned off, data '1' may be stored. As such, a logic level of data may vary according to the present disclosure.

Figure 11B:
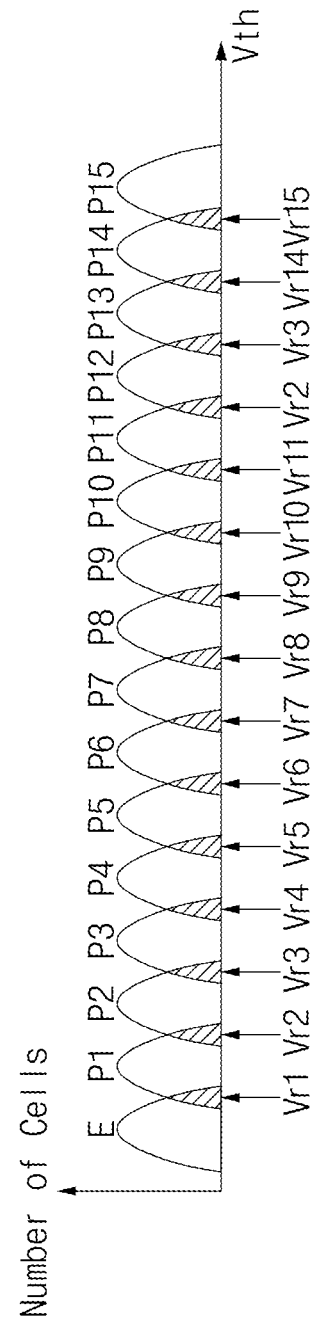
FIG. 11B is a graph showing cases where a threshold voltage of memory cells in the graph of FIG. 11A is changed.

FIG. 11B is a graph showing cases where a threshold voltage of memory cells in the graph of FIG. 11A is changed.

Referring to FIG. 11B, memory cells respectively programmed to the erase state E and the first through fifteenth program states P1 through P15 may have a changed distribution as shown in FIG. 11B according to a read environment. In FIG. 11B, memory cells belonging to hatched portions may have read errors, thereby reducing the reliability of a nonvolatile memory device.

For example, when a read operation is performed on a memory device by using the first read voltage Vr1, although memory cells included in a hatched portion are programmed to the first program state P1, the memory cells may be determined to have the erase state E due to a decrease in the threshold voltage Vth. Accordingly, an error may occur in the read operation, thereby reducing the reliability of the nonvolatile memory device.

When data is read from the nonvolatile memory device 400a, a raw bit error rate (RBER) may vary according to a voltage level of a read voltage. An optimum or, alternatively, desirable voltage level of a read voltage maybe determined according to a distribution pattern of the memory cells. Accordingly, as a distribution of the memory cells changes, an optimum or, alternatively, desirable voltage level of a read voltage needed to read data from the nonvolatile memory device may change.

Figures 11C, 11D:
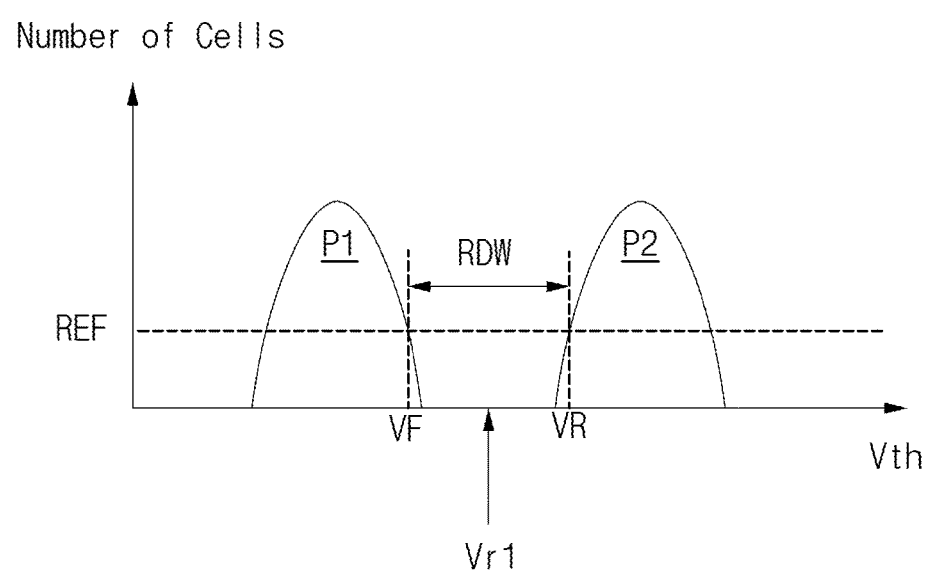
FIG. 11C illustrates a table for explaining bit mapping for programming memory cells according to example embodiments.
FIG. 11D is a graph showing enlarged first and second program states of FIG. 11A.

FIG. 11C illustrates a table for explaining bit mapping for programming memory cells according to example embodiments.

For convenience of explanation, the present embodiment assumes a case where a memory cell is a QLC. However, in other embodiments the memory cell may be a different type other than a QLC.

Referring to FIG. 11C, when memory cells are QLCs, each of the memory cells may store a least significant bit (LSB), an extra significant bit (ESB), an upper significant bit (USB), and a most significant bit (MSB). Further referring to FIG. 8, LSBs stored in memory cells in a first row from among the memory cells connected to the word-line WL1 may form a first page, and MSBs stored therein may form a fourth page. USBs stored in the memory cells in the first row from among the memory cells connected to the word-line WL1 may form a third page, and ESB stored therein may form a second page.

FIG. 11D is a graph showing enlarged first and second program states of FIG. 11A.

Referring to FIG. 11D, a read window RDW between the first and second program states P1 and P2 may be defined as a difference between a fall voltage VF corresponding to the first program state P1 and a rise voltage VR corresponding to the second program state P2. Here, the fall voltage VF may represent a threshold voltage where the number of "off" cells corresponds to a reference number REF, based on an "off" cell count result for memory cells programmed to the first program state P1. The rise voltage VR may represent a threshold voltage where the number of "off" cells corresponds to the reference number REF, based on an "off" cell count result for memory cells programmed to the second program state P2. A read voltage Vr2 for determining the second program state P2 should have a voltage level within the read window RWD, and in order to decrease a read error, the read window RWD should be sufficiently widely secured.

Figure 12:
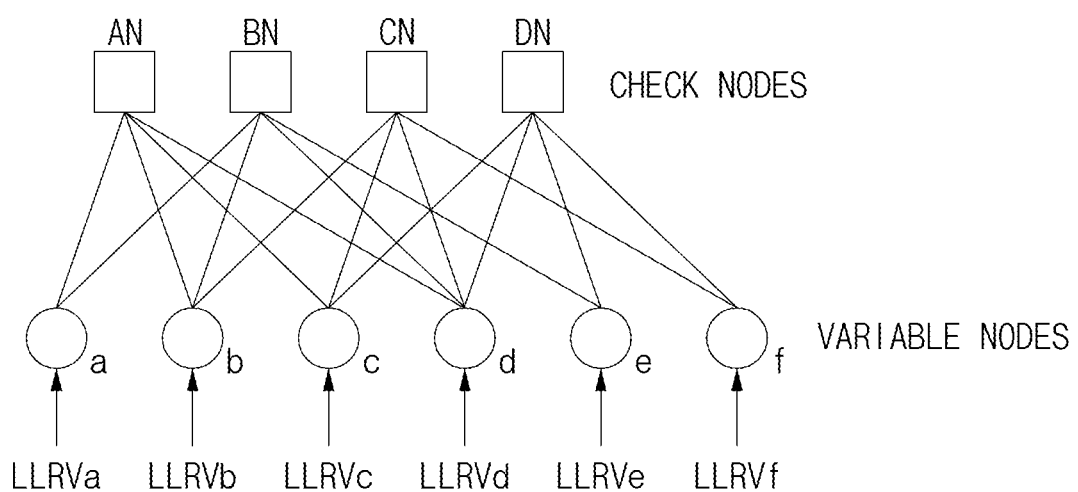
FIG. 12 illustrates an example of a Tanner graph for explaining an ECC decoding operation according to example embodiments.

FIG. 12 illustrates an example of a Tanner graph for explaining an ECC decoding operation according to example embodiments.

It is assumed that the ECC decoder 520 in FIG. 4 performs an ECC decoding operation based on a low-density parity check (LDPC) code.

An LDPC code has an error correction capability near a channel capacity and is widely used in communication systems, communication standards, memory controllers, etc. The LDPC code is a linear block code that may be defined as a parity check matrix (PCM). Here, the definition of a code may be a relation between information and parity.

The LDPC code having a codeword length of s and an information length of t may be represented by the PCM having a size of $(s-t)*s$. In general, the LDPC code has a higher correction capability as the codeword length is long. The codeword may correspond to a sector.

Referring to FIG. 12, the Tanner graph includes variable nodes a, b, c, d, e and f, check nodes AN, BN, CN and DN and edges connecting the variable nodes a, b, c, d, e and f and the check nodes AN, BN, CN and DN. The variable nodes a, b, c, d, e and f are related with codeword bits and the check nodes AN, BN, CN and DN are related with parity check constraints. The component "1" of the PCM corresponds to an edge of the Tanner graph. The number of the edges connected to each node is defined as a degree of the node.

The ECC decoder 520 may apply log likelihood ratio (LLR) values LLRVa, LLRVb, LLRVc, LLRVd, LLRVe and LLRVf to the variable nodes a, b, c, d, e and f, respectively.

Figure 13:
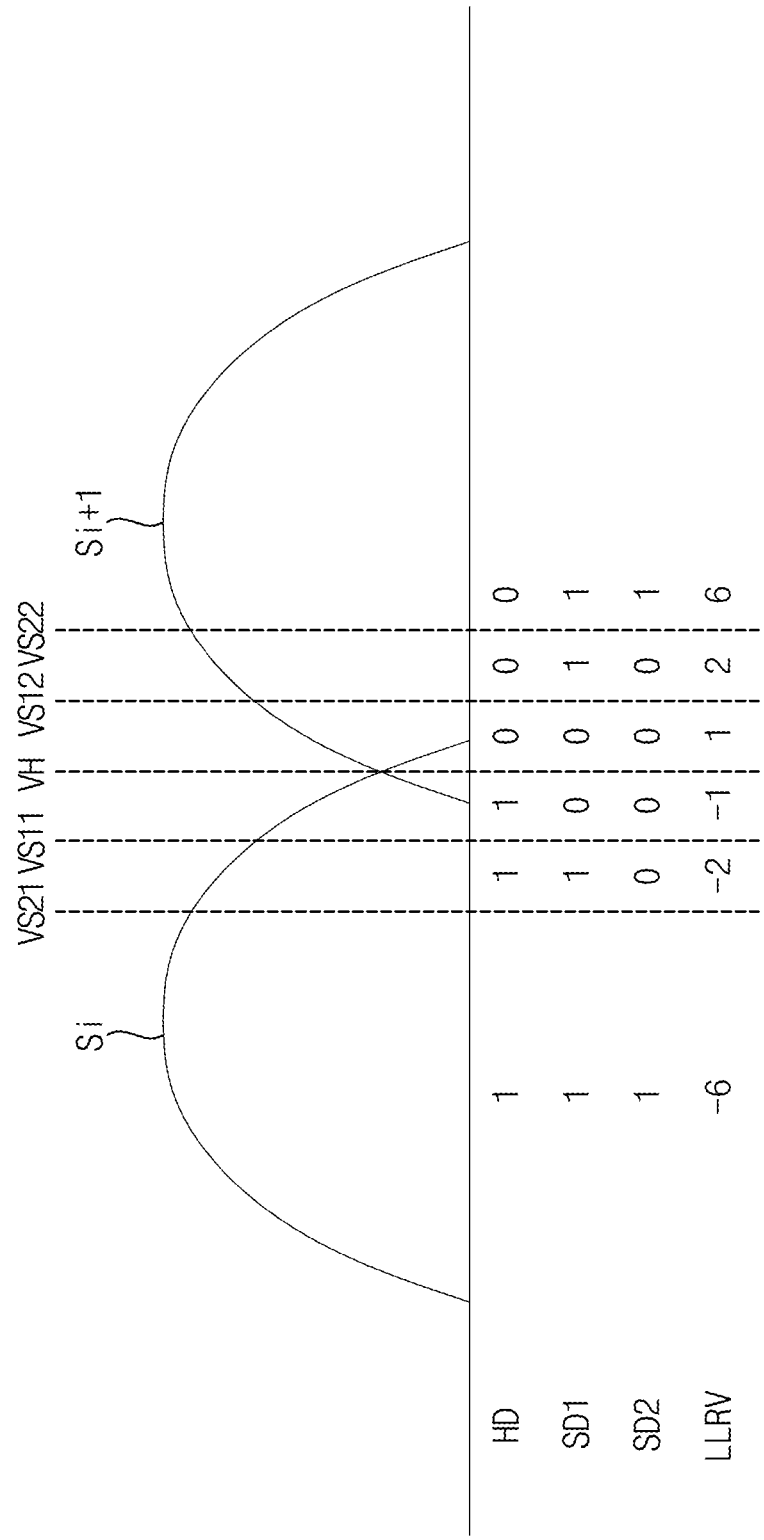
FIG. 13 illustrates that the ECC decoder performs an ECC decoding operation on data bits read from a plurality of sectors according to example embodiments.

FIG. 13 illustrates that the ECC decoder performs an ECC decoding operation on data bits read from a plurality of sectors according to example embodiments.

Referring to FIG. 13, the ECC decoder 520 may perform a hard-decision decoding HD on each of a plurality of data units read from the plurality of sectors based a default read voltage VH, and may perform a first soft-decision decoding SD1 and a second soft-decision decoding SD2 on a second read data read from a selected sector selected from among the plurality of sectors based on offset read voltages VS11, VS12, VS21 and VS22. The offset read voltages VS11, VS12, VS21 and VS22 may have offsets with respect to the default read voltage VH. Each reliability of the data bits on which the hard decision decoding HD is performed corresponds to '−6, −2, −1, 1, 2 and 6' which are determined by the LLR values.

The hard-decision decoding may refer to a decoding based on a normal data read operation and reads the data stored in the memory cell as '1' or '0', depending on whether the memory cell is the on-cell or the off-cell, when the voltage having the read level is applied to the word line of the memory cell. A hard-decision read voltage refers to the default read voltage VH. When the default read voltage VH is applied to the memory cell through the word-line, a hard-decision data becomes '1' if the memory cell is an on-cell, and the hard-decision data becomes '0' if the memory cell is an off-cell.

The soft-decision decoding may refer to a decoding that adds reliability to the hard decision data by applying offset read voltages (i.e., soft-decision read voltages) to the memory cells.

As shown in FIG. 13, first soft-decision data determined by applying offset read voltages VS11 and VS12 to the word-line coupled to the memory cells are '1, 1, 0, 0, 1 and 1', and second soft-decision data determined by applying offset read voltages VS21 and VS22 to the word-line coupled to the memory cells are '1, 0, 0, 0, 0 and 1'.

When the first soft-decision data and the second soft-decision data correspond to '11', a reliability of the hard-decision data is strong. When the first soft-decision data and the second soft-decision data correspond to '00', a reliability of the hard-decision data is weak.

Absolute values of the LLR values may indicate reliability of the hard-decision data.

Figure 14:
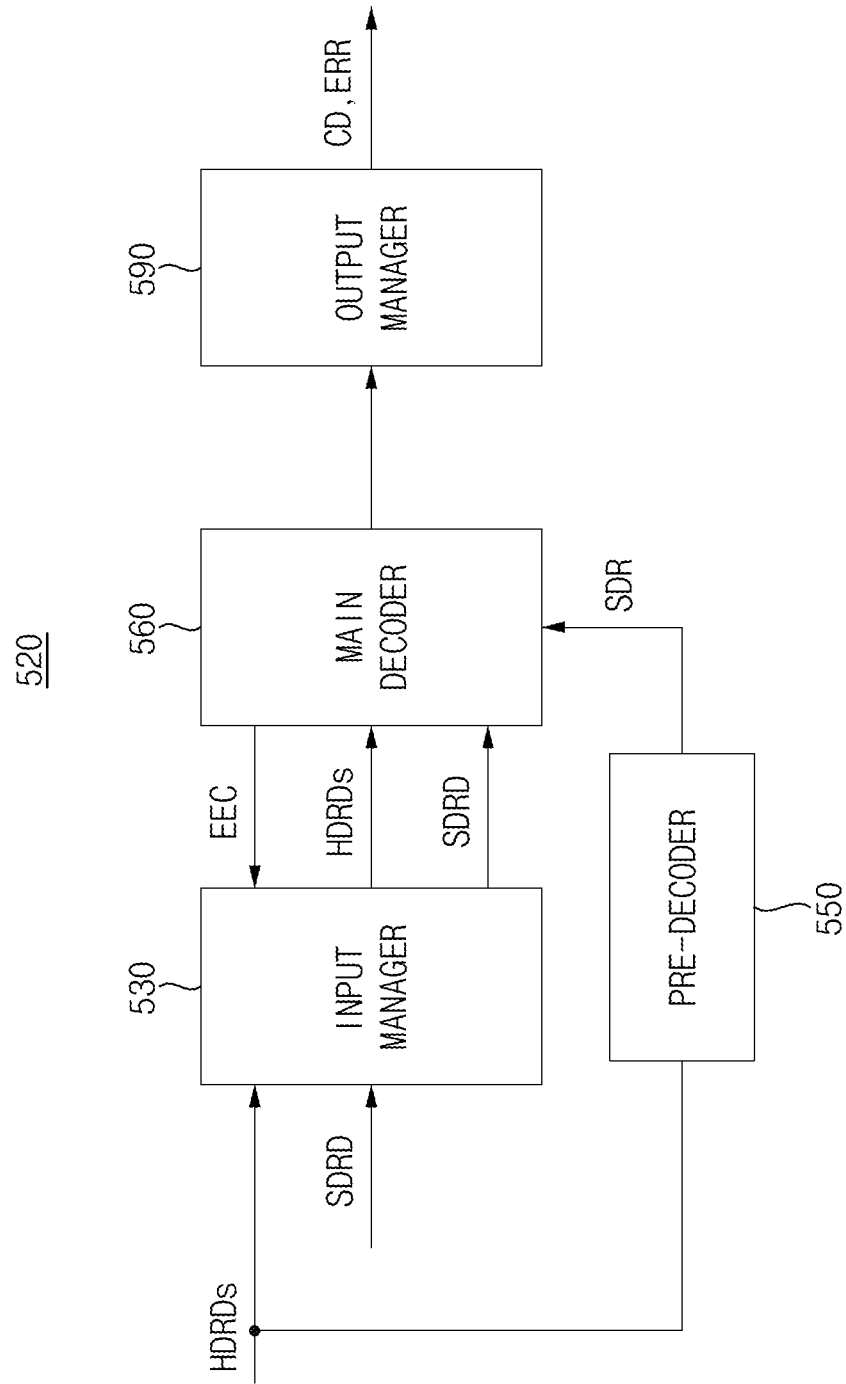
FIG. 14 is a block diagram illustrating an example of an ECC decoder according to example embodiments.

FIG. 14 is a block diagram illustrating an example of an ECC decoder according to example embodiments.

The nonvolatile memory device 400a may perform a read operation including a hard decision read operation and/or a soft decision read operation on a plurality of sectors in a target page. The hard decision read operation reads the hard decision data stored in the memory cell as 1 or 0, depending on whether the memory cell coupled to a target word-line is the on-cell or the off-cell, when the default read voltage is applied to the target word-line. The ECC decoder 520 may perform hard decision type of error correction based on the hard decision data and an error correction code (i.e., LDPC code). The soft decision read operation reads the soft decision data having reliability information on the hard decision data, from the memory cells coupled to the target word-lines when offset read voltages having offsets with respect to the default read voltage are applied to the target word-line. The ECC decoder 520 may perform soft decision type of error correction based on the hard decision data, the reliability information on the hard decision data and the error correction code (i.e., LDPC code).

Referring to FIG. 14, the ECC decoder 520 may include an input manager 530, a pre-decoder 550, a main decoder 560 and an output manager 590.

The input manager 530 may receive a first read data including a plurality of data units HDRDs read from a plurality of sectors of a target page, sequentially by unit of sector.

The pre-decoder 550 may receive the first read data including the plurality of data units HDRDs sequentially by unit of sector in parallel with the input manager 530 receiving the first read data, may generate a syndrome SDR of each of the plurality of data units HDRDS sequentially and may provide the syndrome SDR to the main decoder 560. The syndrome SDR may indicate whether each of the plurality of data units HDRDS includes at least one error bit.

The main decoder 560 may receive the plurality of data units HDRDs sequentially from the input manager 530, may perform a first ECC decoding on the plurality of data units HDRDs based on the respective syndrome SDR, sequentially by unit of sector, and may determine pass/fail of the first ECC decoding on each of the plurality of data units HDRDs.

The input manager 530, in response to the first ECC decoding on a first data unit of the plurality of data units HDRDs being failed, may store the first data unit in a defective sector buffer therein, based on a result of the first ECC decoding on each of the plurality of data units HDRDs, in response to the first ECC decoding on a second data unit of the plurality of data units HDRDs being failed, may selectively store the second data unit in the defective sector buffer based on an expected error count EEC of each of the first data unit and the second data unit and may provide the main decoder 560 with a defective data unit of which expected error count is relatively small. Each of the plurality of data units HDRDs may correspond to a hard decision data that is read from each of the plurality of sectors based on a default read voltage.

The main decoder 560 may perform a second ECC decoding on the defective data unit of which expected error count is relatively small and a second read data SDRD read from a selected sector corresponding to the defective data unit, from among the plurality of sectors and may provide the output manager 590 with a result of the second ECC decoding. The second read data SDRD may correspond to a soft-decision data that is read from the selected sector based on offset read voltages that have an offset with respect to the default read voltage.

The output manager 590 may output a decoded data CD or a read error message ERR based on the result of the second ECC decoding.

Figure 15:
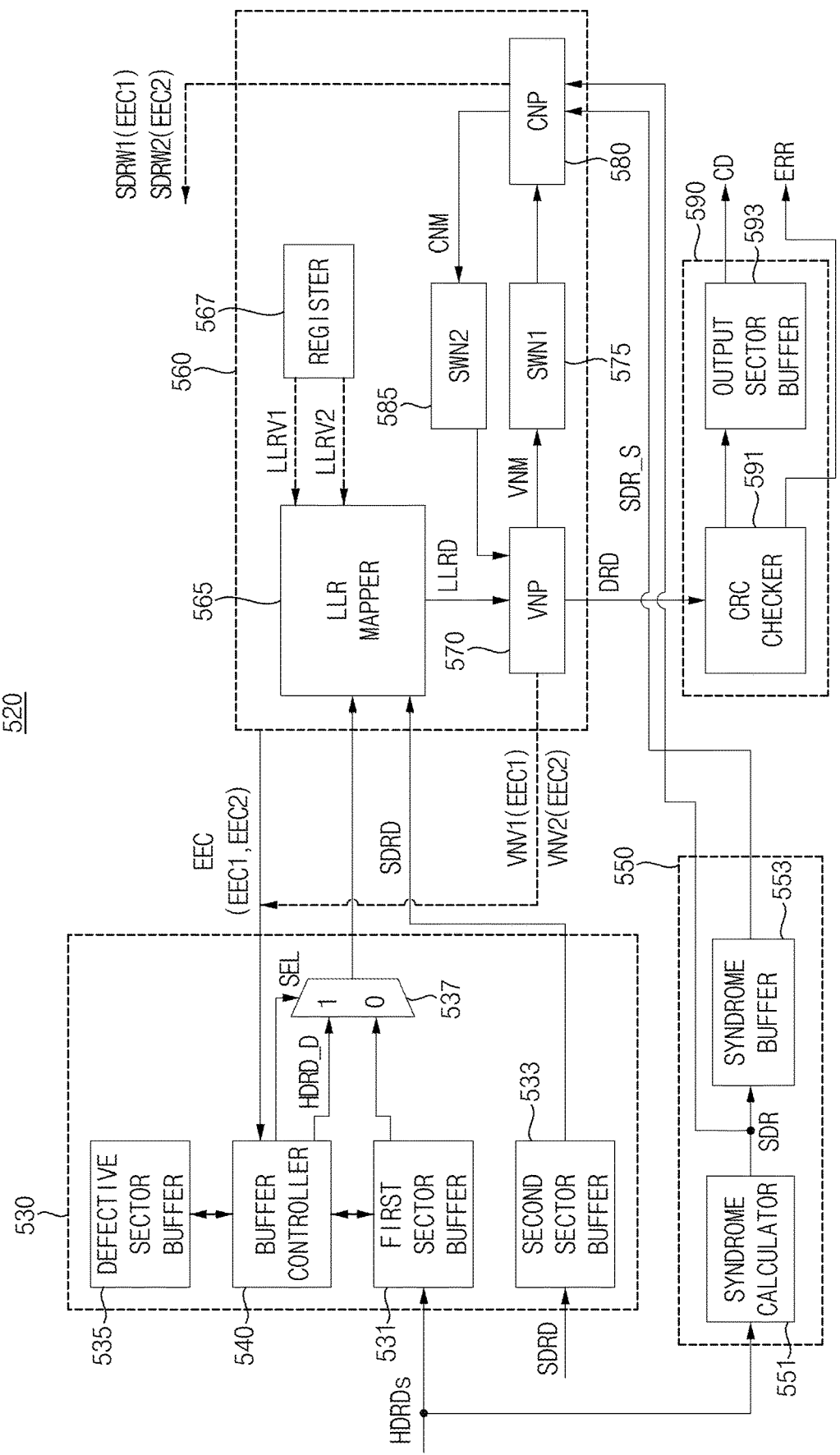
FIG. 15 is a block diagram illustrating the ECC decoder of FIG. 14 in detail according to example embodiments.

FIG. 15 is a block diagram illustrating the ECC decoder of FIG. 14 in detail according to example embodiments.

Referring to FIG. 15, the ECC decoder 520 may include the input manager 530, the pre-decoder 550, the main decoder 560 and the output manager 590.

The input manager 530 may include a first sector buffer 531, a second sector buffer 533, a defective sector buffer 535, a buffer controller 540 and a multiplexer 537.

The first sector buffer 531 may sequentially store the plurality of data units HDRDs by unit of sector. The second sector buffer 533 may store the second read data SDRD and may provide the second read data SDRD to the main decoder 560 when the second ECC decoding is performed.

The defective sector buffer 535 may store the first data unit on which the first ECC decoding is failed, from among the plurality of data units HDRDs, and may selectively store a second data unit based on an expected error count of each of the first data unit and the second data unit, provided from the main decoder 560, in response to the first ECC decoding on the second data unit of the plurality of data units HDRDs being failed.

The buffer controller 540 may firstly store the first data unit on which the first ECC decoding is failed in the defective sector buffer 535 and may selectively store the second data unit on which the first ECC decoding is failed in the defective sector buffer 535 based on a first expected error count EEC1 of the first data unit and a second expected error count EEC2 of the second data unit.

In response to the second expected error count EEC2 being smaller than the first expected error count EEC1, the buffer controller 540 may update the second data unit in the defective sector buffer 535. In response to the second expected error count EEC2 being equal to or greater than the first expected error count EEC1, the buffer controller 540 may maintain the first data unit in the defective sector buffer 535.

Therefore, when the first ECC decoding on two or more data units from among the plurality of data units HDRDs is failed, the buffer controller 540 may update a data unit having a minimum expected error count in the defective sector buffer 535.

The buffer controller 540 may provide a selection signal SEL to the multiplexer 537 based on whether the first ECC decoding or the second ECC decoding is performed.

When the first ECC decoding on the plurality of data units HDRDs is performed, the buffer controller 540 may generate the selection signal SEL with a first logic level (i.e., a logic low level) and the multiplexer 537 may provide the main decoder 560 with each of the plurality of data units HDRDs sequentially received from the first sector buffer 531, in response to the selection signal SEL with a first logic level.

When the second ECC decoding on is performed, the buffer controller 540 may generate the selection signal SEL with a second logic level (i.e., a logic high level) and provide the multiplexer 537 with a defective data unit HDRD_D having a minimum expected error count may, which is stored in the defective sector buffer 535, and the multiplexer 537 may provide the main decoder 560 with the defective data unit HDRD_D having a minimum expected error count, in response to the selection signal SEL with a first logic level.

The pre-decoder 550 may include a syndrome calculator 551 and a syndrome buffer 553 connected to the syndrome calculator 551.

The syndrome calculator 551 may sequentially generate a syndrome SDR of each of the plurality of data units HDRDs when the first ECC decoding is performed on each of the plurality of data units HDRDs and may provide the syndrome SDR to the main decoder 560.

The syndrome buffer 553 may store a first syndrome associated with the first data unit on which the first ECC decoding is failed, and may selectively update a second syndrome associated with the second data unit in response to the second data unit being selectively updated in the defective sector buffer 535.

The syndrome buffer 553 may provide the main decoder 560 with a syndrome stored therein as a selected syndrome SDR_S when the second ECC decoding is performed.

The main decoder 560 may include an LLR mapper 565, a register 567, a variable node processor VNP 570, a first switch network SWN1 575, a check node processor CNP 580 and a second switch network SWN2 585. The variable node processor 570 may include variable nodes such as the variable nodes a, b, c, d, e and f in FIG. 12 and the check node processor 580 may include check node such as the check nodes AN, BN, CN and DN in FIG. 12.

The register 567 may store first LLR values LLRV1 associated with the first ECC decoding and second LLR values LLRV2 associated with the second ECC decoding and may provide the first LLR values LLRV1 and the second LLR values LLRV2 to the LLR mapper 565.

The LLR mapper 565 may output LLR data LLRD to the variable node processor 570 by mapping the first LLR values LLRV1 to the each of plurality of data units HDRDs provided from the input manager 530 in the first ECC decoding (i.e., hard decision decoding) and may output the LLR data LLRD to the variable node processor 570 by mapping the second LLR values LLRV2 to the defective data unit HDRD_D and the second read data SDRD provided from the input manager 530 in the second decoding (i.e., soft decision decoding).

The main decoder 560 may update values of the variable nodes and values of the check nodes by performing node operation based on the LLR data LLRD and may output a decoding result data DRD to the output manager 590.

During the LDPC decoding, a nonzero element in the parity check matrix means that a corresponding variable node and a corresponding check node are connected to each other. The decoding is performed through data transmitted according to the connection of the variable node and the check node.

The variable node processor 570 may include the variable nodes a, b, c, d, e and f in FIG. 12, may store the LLR data LLRD and may provide the stored LLR data LLRD, as a variable node message VNM, to the first switch network 575. The check node processor 580 may be connected to the variable node processor 570 through the first switch network 575, may include the check nodes AN, BN, CN and DN in FIG. 12, may process values of the variable nodes with respect to each of the check nodes AN, BN, CN and DN with reference to the variable node message VNM, and may provide a check node message CNM to the second switch network 585.

The check node processor 580, while the first ECC decoding is being performed, may generate a first syndrome weight SDRW1 based on the first syndrome associated with the first data unit, may generate a second syndrome weight SDRW2 based on the second syndrome associated with the second data unit and may provide the buffer controller 540 in the input manager 530 with the first syndrome weight SDRW1 and the second syndrome weight SDRW2 as the first expected error count EEC1 and the second expected error count EEC2, respectively. Each of the first syndrome weight SDRW1 and the second syndrome weight SDRW2 indicates a number of bits having a first logic level in each of the first syndrome and the second syndrome in a plurality of iterations of the first ECC decoding on each of the first data unit and the second data unit.

The variable node processor 570 may be connected to the check node processor 580 through the second switch network 557, may update values of the variable nodes a, b, c, d, e and f with reference to the check node message CNM, may perform decoding on the LLR data LLRD according to the updated values of the variable nodes and may output the decoding result data DRD indicating a result of the decoding to the output manager 590.

The variable node processor 570, while the first ECC decoding is being performed, may provide the buffer controller 540 in the input manager 530 with updated values VNV1 and VNV2 of the variable nodes as the first expected error count EEC1 and the second expected error count EEC2. Each of the updated values VNV1 and VNV2 may be associated with each of the first data unit and the second data unit.

The main decoder 560 may provide the buffer controller 540 with intermediate data which is generated during performing the first ECC decoding on each of the first data unit and the second data unit and is associated with a number of error bits as the first expected error count EEC1 and the second expected error count EEC2, respectively.

The output manager 590 may output the decoded data CD by correcting error in the defective data unit HDRD_D or may output the read error message EER when the error is uncorrectable, based on the decoding result data DRD from the variable node processor 570.

The output manager 590 may include a cyclic redundancy check (CRC) checker 591 and an output sector buffer 593.

The CRC checker 591 may perform CRC on the decoding result data DRD and may store a corrected data in the output sector buffer 593 when the error of the decoding result data DRD is correctable and the output sector buffer 593 may output the corrected data as the decoded data CD. The CRC checker 591 may perform CRC on the decoding result data DRD and may output the read error message ERR when the error of the decoding result data DRD is uncorrectable.

If the decoding is correctly performed, the ECC decoder 520 outputs the corrected data as the decoded data CD. If the decoding is not correctly performed (e.g., all errors of the read data are not corrected), the ECC decoder 520 re-updates the check nodes and the variable nodes.

The above update and provisional decoding of check nodes and variable nodes are iteratively performed. The update and provisional decoding of check nodes and variable nodes may constitute a single decoding loop, that is, a decoding iteration.

When the first ECC decoding is performed in the ECC decoder 520 and the first ECC decoding on at least a portion of the plurality of data units is failed, the main decoder 560 may transmit a fail message to the input manger 530 and the input manger 530 may transmit a read request for the second ECC decoding to the processor 310.

Figure 16:
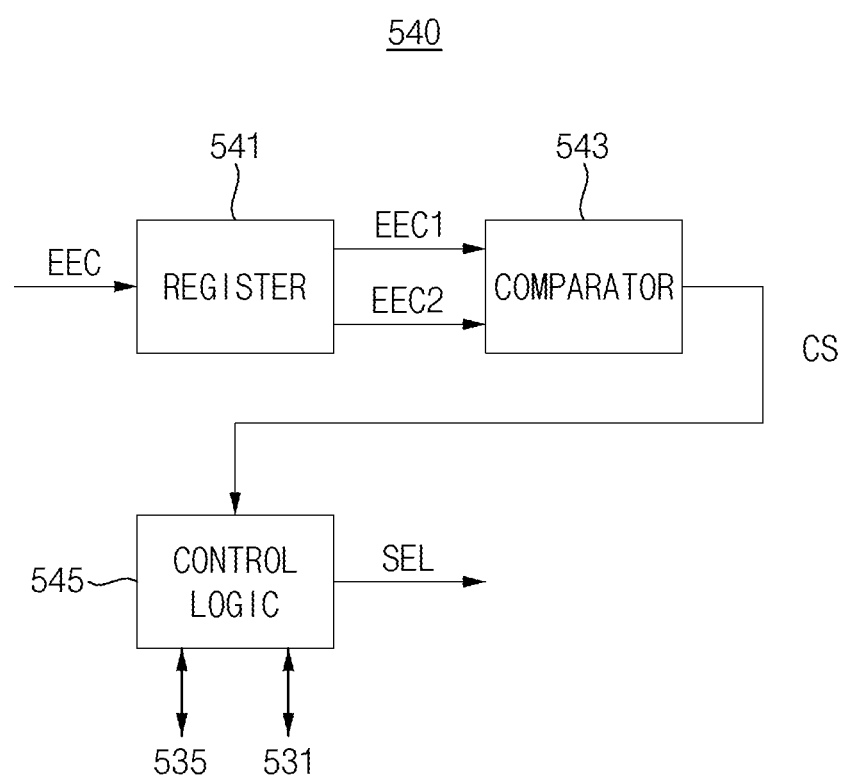
FIG. 16 is a block diagram illustrating an example of the buffer controller in the input manager in the ECC decoder of FIG. 15 according to example embodiments.

FIG. 16 is a block diagram illustrating an example of the buffer controller in the input manager in the ECC decoder of FIG. 15 according to example embodiments.

Referring to FIG. 16, the buffer controller 540 may include a register 541, a comparator 543 and a control logic 545.

The register 541 may store the expected error count EEC of each of the first data unit and the second data unit on which the first ECC decoding is failed, from among the plurality of data units HDRDs, may provide the comparator 543 with the expected error count EEC of each of the first data unit and the second data unit on which the first ECC decoding is failed as the first expected error count EEC1 and the second expected error count EEC2, respectively.

The comparator 543 may generate a comparison signal CS by comparing the first expected error count EEC1 and the second expected error count EEC2 and may provide the comparison signal CS to the control logic 545.

The control logic 545 may be connected to the defective sector buffer 535 and the first sector buffer 531 and may control an updating operation of the defective sector buffer 535 based on the comparison signal CS. That is, the control logic 545 may control updating of the first data unit and the second data unit in the defective sector buffer 535 based on the comparison signal CS. In addition, the control logic 545 may generate the selection signal SEL with a first logic level when the first ECC decoding is performed, may generate the selection signal SEL with a second logic level when the second ECC decoding is performed and may provide the selection signal SEL to the multiplexer 537.

Figure 17:
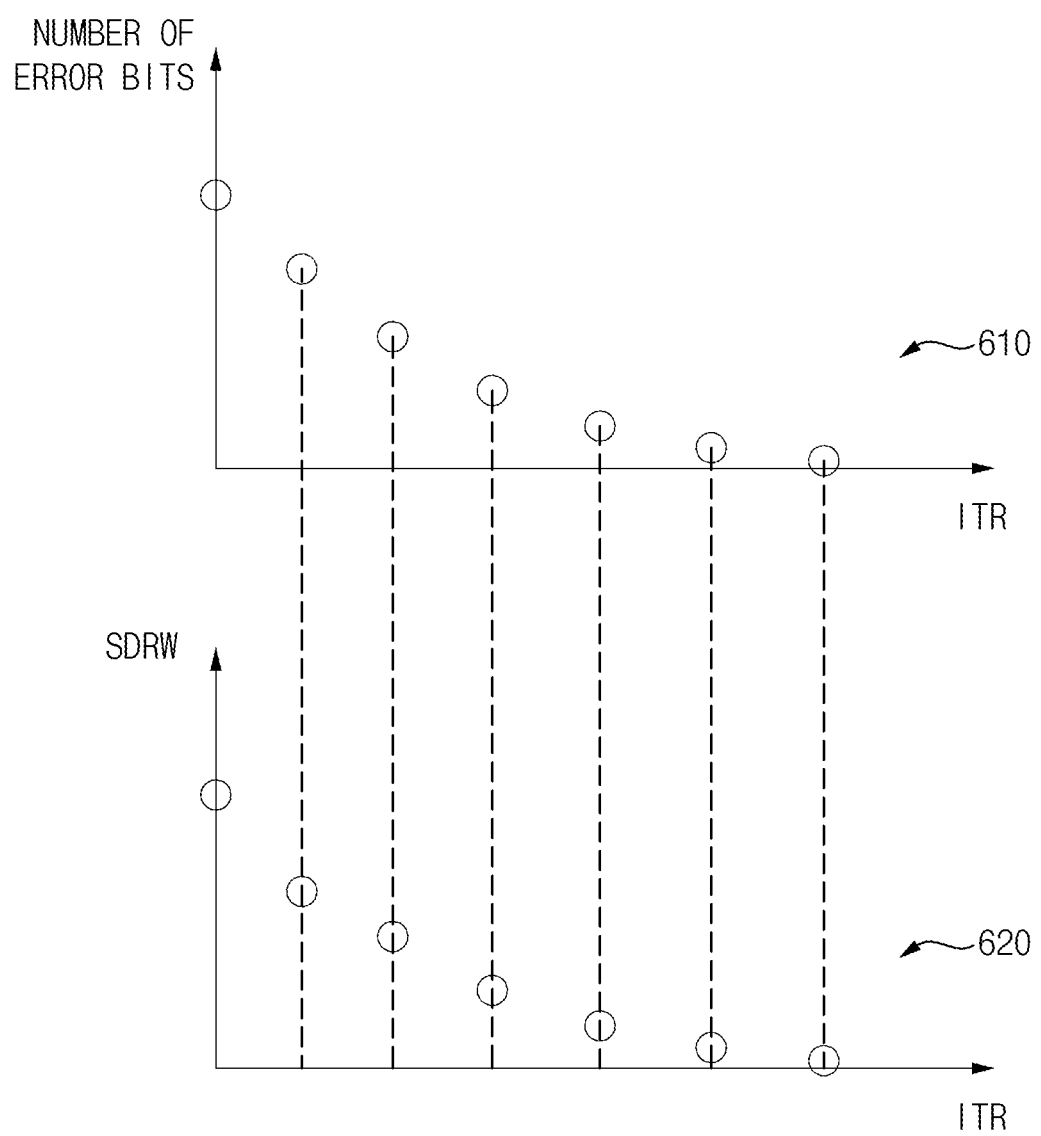
FIG. 17 illustrates a relationship between a syndrome weight generated during the first ECC decoding and error bits.

FIG. 17 illustrates a relationship between a syndrome weight generated during the first ECC decoding and error bits.

In FIG. 17, a reference numeral 610 indicates a change of error bits detected in the first ECC decoding as an iteration ITR increases and a reference numeral 620 indicates a change of the syndrome weight SDRW generated during the first ECC decoding being performed as the iteration ITR increases.

Referring to FIG. 17, it is noted that a number of error bits detected in the first ECC decoding decrease as the iteration ITR increases and thus the syndrome weight SDRW decreases as the iteration ITR increases.

Figures 18A, 18B:
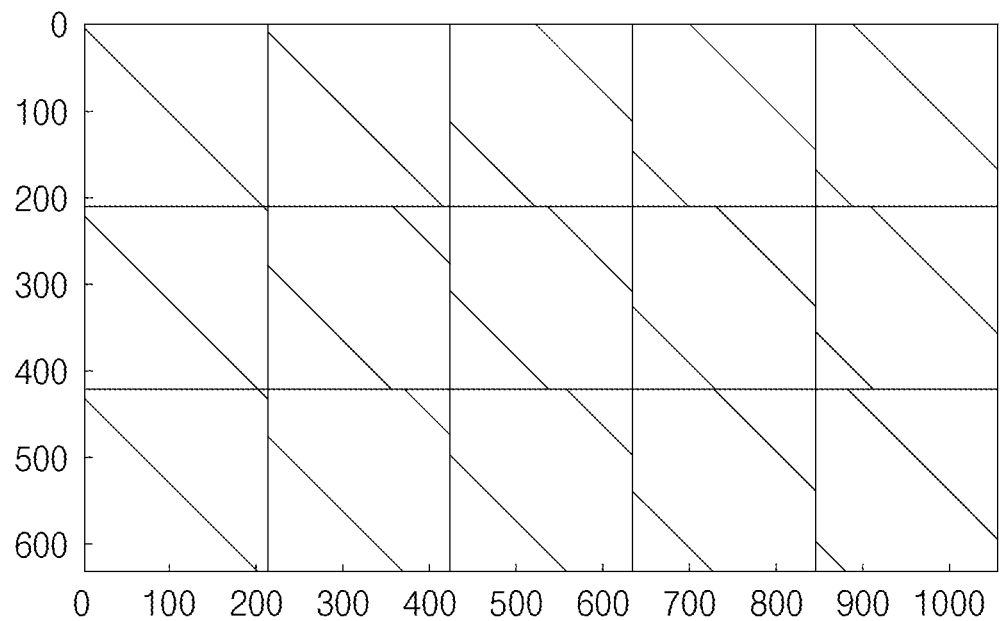
FIGS. 18A and 18B are diagram for describing a low density parity check applicable to the ECC decoding according to example embodiments.

FIGS. 18A and 18B are diagrams for describing a low density parity check applicable to the ECC decoding according to example embodiments.

An LDPC code having a codeword length of s and an information length of t may be represented by a parity check matrix (PCM) having a size of $(s-t)*s$. The LDPC code has a higher correction capability as the codeword length is long. For example, the memory controller may use a codeword longer than 1 KB. For example s is greater than 8192. The size of the PCM of the long codeword is very large and it is difficult to store the PCM of a large size.

To solve such problems, the PCM may be divided into a plurality of sub blocks (i.e., sub matrices) and the PCM may be defined by information of each sub matrix, for example, a position of each sub matrix, a shape of each sub matrix, etc. The LDPC code defined as such may be referred to as a quasi-cyclic LDPC (QC-LDPC) code. For example, it is assumed that the codeword length is 1055 bits and the information length is 422 (=1055-633). If the size of the sub matrix is 211, five sub matrices may be arranged in each row (1055/211=5) and three sub matrices may be arranged in each column (633/211=3) as illustrated in FIG. 18A. Each sub matrix may be obtained by a circular shifting of an identity matrix. The PCM may be simplified to a 3*5 matrix as illustrated in FIG. 18B using shifter numbers of the sub matrices. In other words, the PCM may be represented simply in comparison with the representation of 633*1055 matrix. The QC-LDPC code may be efficiently applied to various systems.

Figure 19:
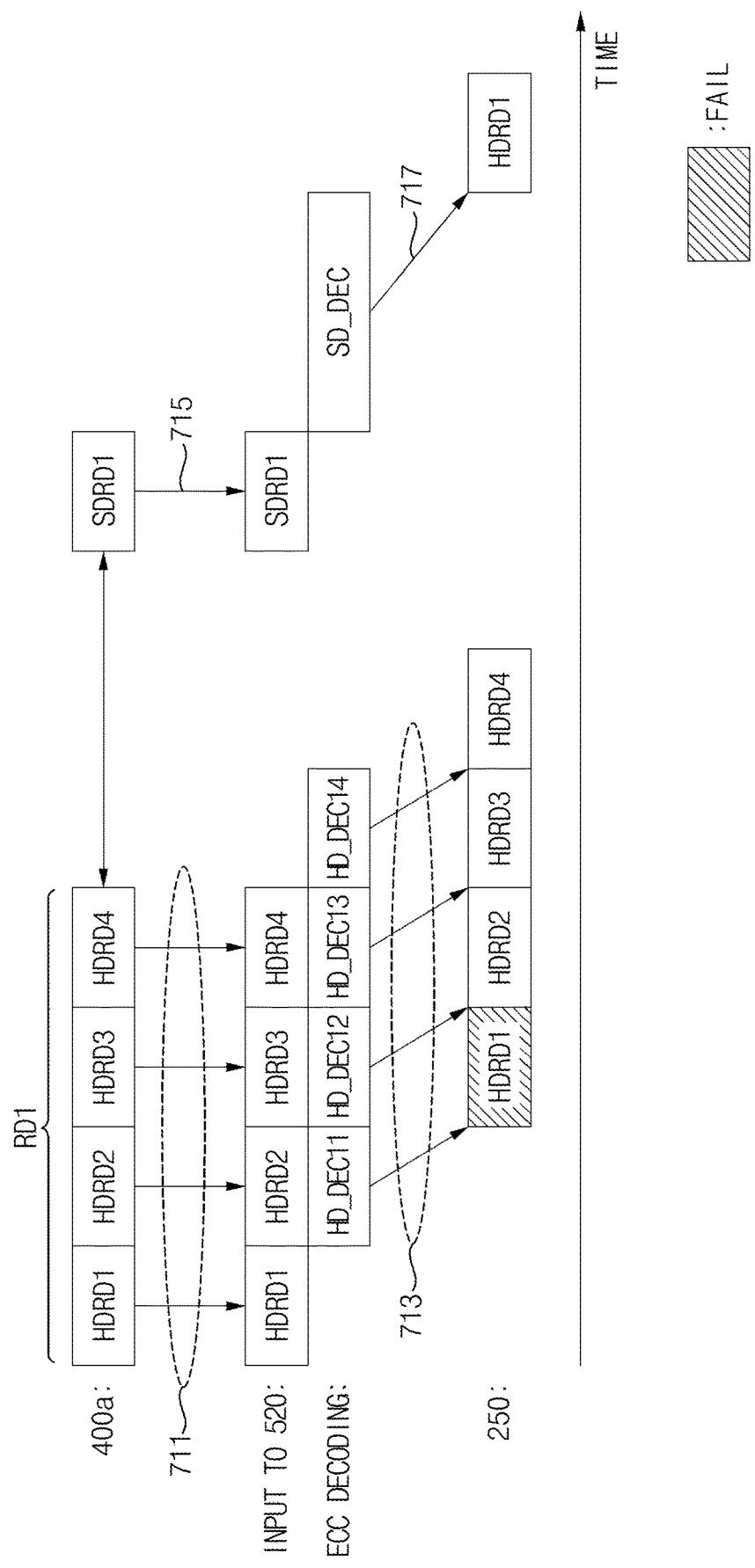
FIG. 19 illustrates an example operation of the ECC decoder of FIG. 15 over time according to example embodiments.

FIG. 19 illustrates an example operation of the ECC decoder of FIG. 15 over time according to example embodiments.

Referring to FIGS. 15 and 19, a plurality of data units HDRD1, HDRD2, HDRD3 and HDRD4 constituting a first read data RD1 are sequentially read from a plurality of sectors of a target page in the memory cell array 420 in the nonvolatile memory device 400a of FIG. 1, the plurality of data units HDRD1, HDRD2, HDRD3 and HDRD4 are provided to the input manager 520 and the plurality of data units HDRD1, HDRD2, HDRD3 and HDRD4 are sequentially stored in the first sector buffer 531 by unit of sector as a reference numeral 711 indicates. In parallel with the plurality of data units HDRD1, HDRD2, HDRD3 and HDRD4 being sequentially stored in the first sector buffer 531, the plurality of data units HDRD1, HDRD2, HDRD3 and HDRD4 are sequentially provided to the pre-decoder 550 and the pre-decoder 550 generates a syndrome of each of the plurality of data units HDRD1, HDRD2, HDRD3 and HDRD4.

The plurality of data units HDRD1, HDRD2, HDRD3 and HDRD4 sequentially stored in the first sector buffer 531 is sequentially provided to the main decoder 560. The main decoder 560 sequentially performs respective one of first ECC decoding HD_DEC11, HD_DEC12, HD_DEC13 and HD_DEC14 on each of the plurality of data units HDRD1, HDRD2, HDRD3 and HDRD4 and determines whether the first ECC decoding on each of the plurality of data units HDRD1, HDRD2, HDRD3 and HDRD4 is successful. Based on a result of the first ECC decoding, it is determined that the first ECC decoding on the data unit HDRD1 is failed and the data unit HDRD1 is stored in the defective sector buffer 535 as a defective data unit.

When the first ECC decoding is completed, the plurality of data units HDRD1, HDRD2, HDRD3 and HDRD4 may be sequentially stored in the buffer memory 250 in FIG. 1 as a reference numeral 713 indicates.

For performing a second ECC decoding, a second read data SDRD1 is read from a sector corresponding to the data unit HDRD1 and the second read data SDRD1 is stored in the second sector buffer 533 as a reference numeral 715 indicates. The main decoder 560 performs a second ECC decoding SD_DEC based on the data unit HDRD1 stored in the defective sector buffer 535 and the second read data SDRD1 and may output a corrected data unit by correcting error in the data unit HDRD1 as a reference numeral 717.

Figure 20:
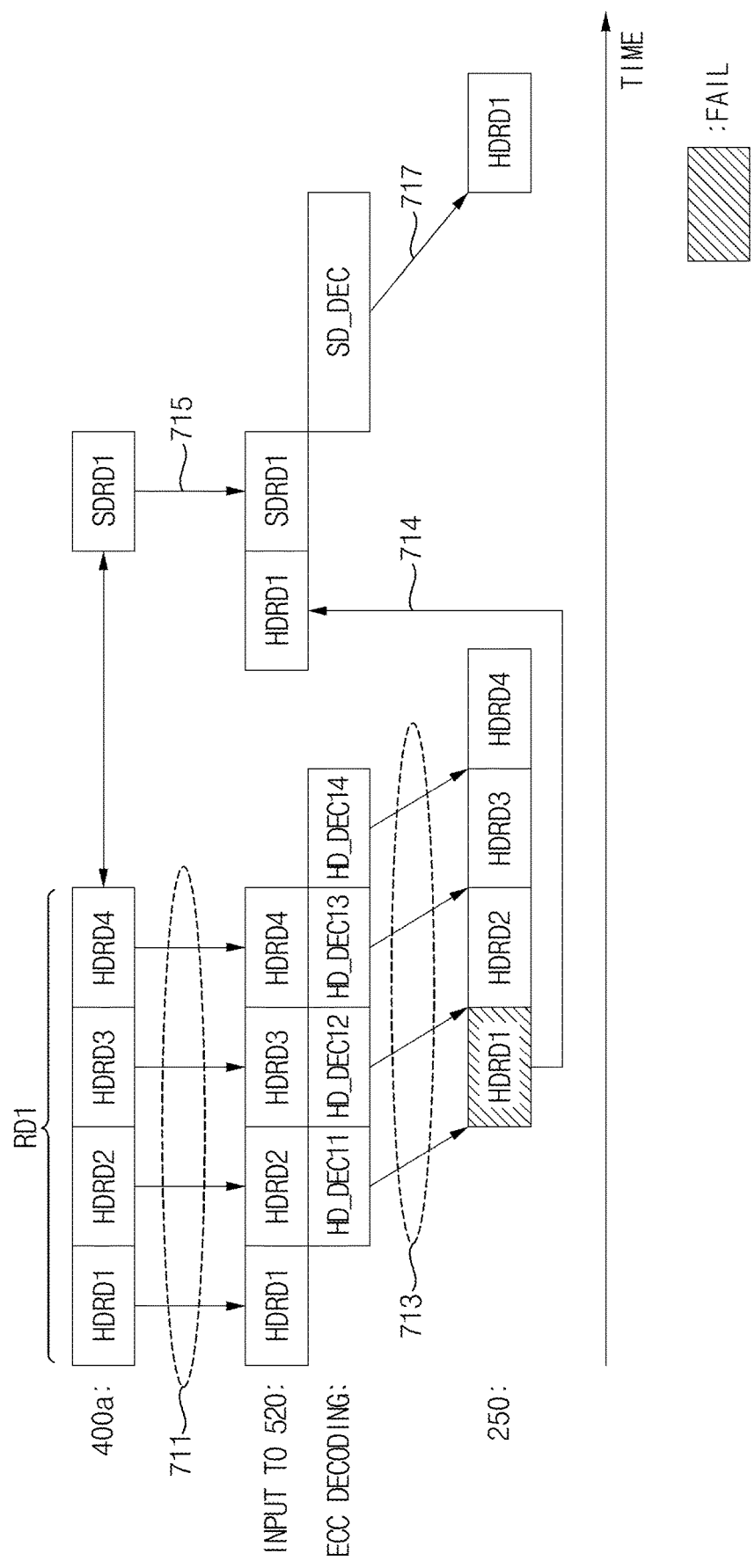
FIG. 20 illustrates an example operation of the ECC decoder of FIG. 15 over time when the ECC decoder does not include a defective sector buffer according to example embodiments.

FIG. 20 illustrates an example operation of the ECC decoder of FIG. 15 over time when the ECC decoder does not include a defective sector buffer according to example embodiments.

Referring to FIGS. 15 and 20, a plurality of data units HDRD1, HDRD2, HDRD3 and HDRD4 constituting a first read data RD1 are sequentially read from a plurality of sectors of a target page in the memory cell array 420 in the nonvolatile memory device 400a of FIG. 1, the plurality of data units HDRD1, HDRD2, HDRD3 and HDRD4 are provided to the input manager 520 and the plurality of data units HDRD1, HDRD2, HDRD3 and HDRD4 are sequentially stored in the first sector buffer 531 by unit of sector as a reference numeral 711 indicates. In parallel with the plurality of data units HDRD1, HDRD2, HDRD3 and HDRD4 being sequentially stored in the first sector buffer 531, the plurality of data units HDRD1, HDRD2, HDRD3 and HDRD4 are sequentially provided to the pre-decoder 550 and the pre-decoder 550 generates a syndrome of each of the plurality of data units HDRD1, HDRD2, HDRD3 and HDRD4.

The plurality of data units HDRD1, HDRD2, HDRD3 and HDRD4 sequentially stored in the first sector buffer 531 are sequentially provided to the main decoder 560. The main decoder 560 sequentially performs respective one of first ECC decoding HD_DEC11, HD_DEC12, HD_DEC13 and HD_DEC14 on each of the plurality of data units HDRD1, HDRD2, HDRD3 and HDRD4 and determines whether the first ECC decoding on each of the plurality of data units HDRD1, HDRD2, HDRD3 and HDRD4 is successful. Based on a result of the first ECC decoding, it is determined that the first ECC decoding on the data unit HDRD1 is failed and the data unit HDRD1 is stored in the defective sector buffer 535 as a defective data unit.

When the first ECC decoding is completed, the plurality of data units HDRD1, HDRD2, HDRD3 and HDRD4 may be sequentially stored in the buffer memory 250 in FIG. 1 as a reference numeral 713 indicates.

For performing a second ECC decoding, the data unit HDRD1 is read from the buffer memory 250 located out of the ECC decoder 520 and is provided to the ECC decoder 520 as a reference numeral 714 indicates and a second read data SDRD1 read from a sector corresponding to the data unit HDRD1 is stored in the second sector buffer 533 as a reference numeral 715 indicates. The main decoder 560 performs a second ECC decoding SD_DEC based on the data unit HDRD1 stored in the defective sector buffer 535 and the second read data SDRD1 and may output a corrected data unit by correcting error in the data unit HDRD1 as reference numeral 717 indicates.

Figure 21:
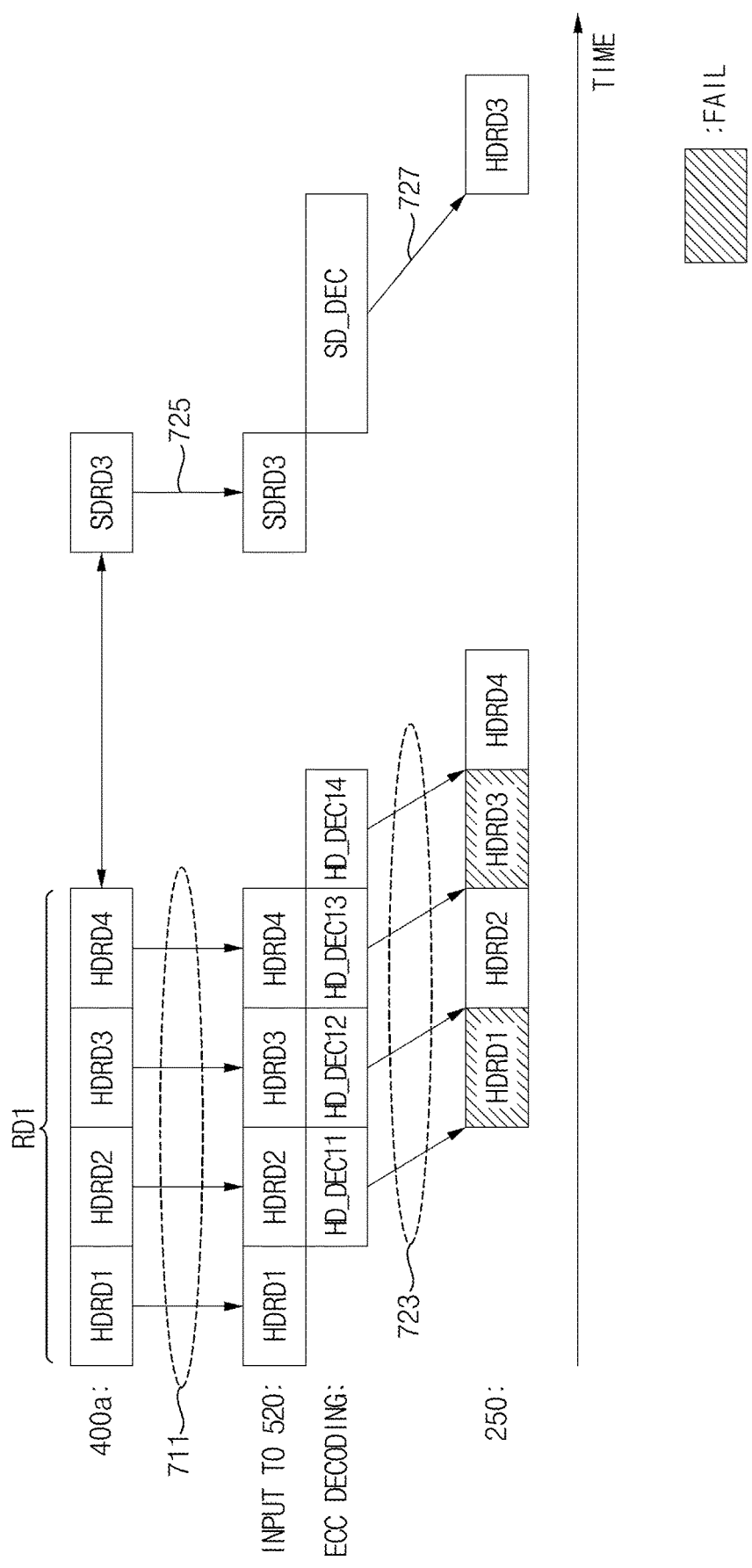
FIG. 21 illustrates an example operation of the ECC decoder of FIG. 15 over time according to example embodiments.

FIG. 21 illustrates an example operation of the ECC decoder of FIG. 15 over time according to example embodiments.

Referring to FIGS. 15 and 21, a plurality of data units HDRD1, HDRD2, HDRD3 and HDRD4 constituting a first read data RD1 are sequentially read from a plurality of sectors of a target page in the memory cell array 420 in the nonvolatile memory device 400a of FIG. 1, the plurality of data units HDRD1, HDRD2, HDRD3 and HDRD4 are provided to the input manager 520 and the plurality of data units HDRD1, HDRD2, HDRD3 and HDRD4 are sequentially stored in the first sector buffer 531 by unit of sector as a reference numeral 711 indicates. In parallel with the plurality of data units HDRD1, HDRD2, HDRD3 and HDRD4 being sequentially stored in the first sector buffer 531, the plurality of data units HDRD1, HDRD2, HDRD3 and HDRD4 are sequentially provided to the pre-decoder 550 and the pre-decoder 550 generates a syndrome of each of the plurality of data units HDRD1, HDRD2, HDRD3 and HDRD4.

The plurality of data units HDRD1, HDRD2, HDRD3 and HDRD4 sequentially stored in the first sector buffer 531 are sequentially provided to the main decoder 560. The main decoder 560 sequentially performs respective one of first ECC decoding HD_DEC11, HD_DEC12, HD_DEC13 and HD_DEC14 on each of the plurality of data units HDRD1, HDRD2, HDRD3 and HDRD4 and determines whether the first ECC decoding on each of the plurality of data units HDRD1, HDRD2, HDRD3 and HDRD4 is successful. Based on a result of the first ECC decoding, it is determined that the first ECC decoding on the data units HDRD1 and HDRD3 is failed and the data unit HDRD3 is stored in the defective sector buffer 535 as a defective data unit because an expected error count of the data unit HDRD3 is smaller than an expected error count of the data unit HDRD1.

When the first ECC decoding is completed, the plurality of data units HDRD1, HDRD2, HDRD3 and HDRD4 may be sequentially stored in the buffer memory 250 in FIG. 1 as a reference numeral 723 indicates.

For performing a second ECC decoding, a second read data SDRD3 is read from a sector corresponding to the data unit HDRD3 and the second read data SDRD3 is stored in the second sector buffer 533 as a reference numeral 725 indicates. The main decoder 560 performs a second ECC decoding SD_DEC based on the data unit HDRD3 stored in the defective sector buffer 535 and the second read data SDRD3 and may output a corrected data unit by correcting error in the data unit HDRD3 as reference numeral 727 indicates.

Figure 22:
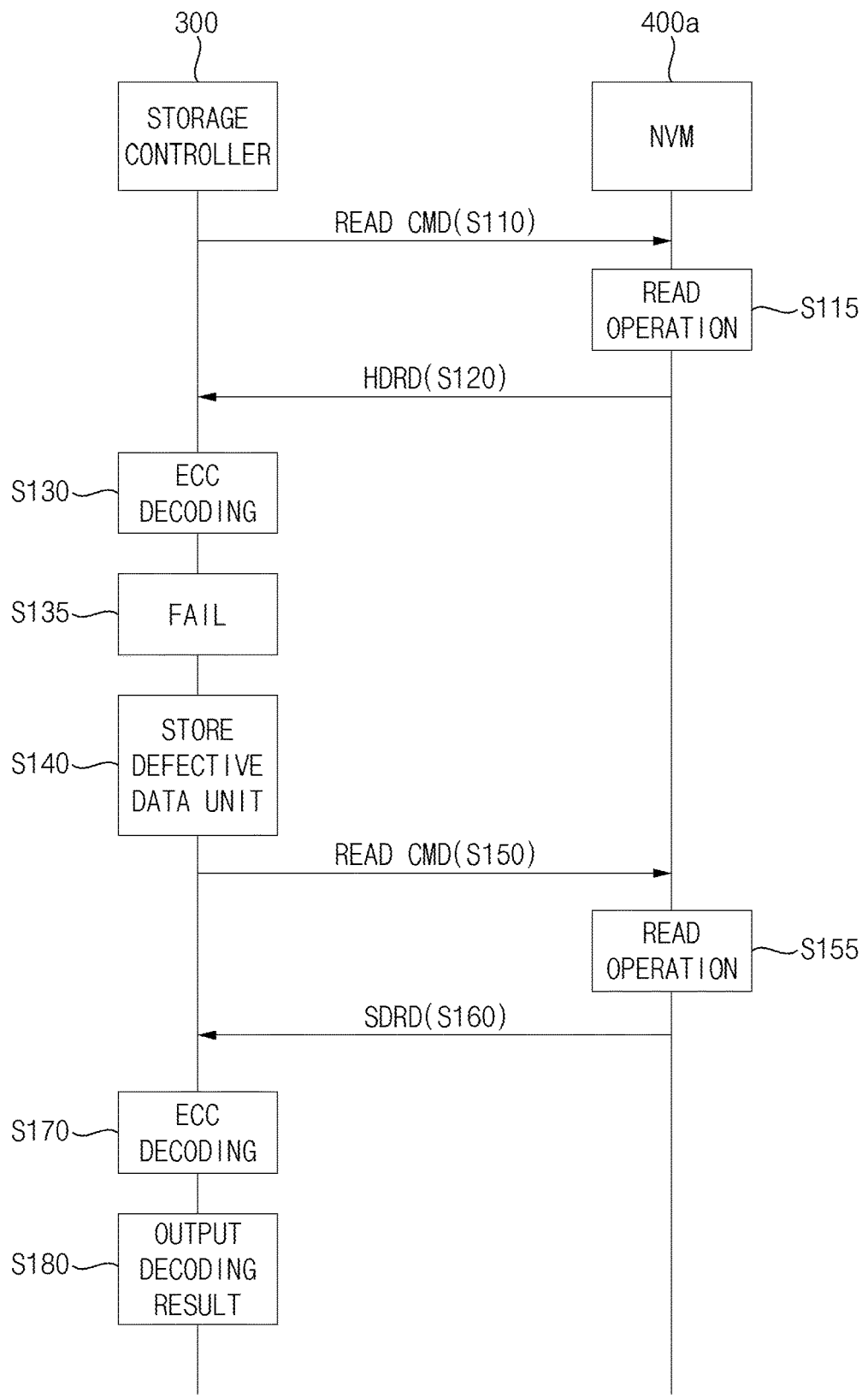
FIGS. 22 and 23 illustrate a method of operating a storage device according to example embodiments.
Figure 23:
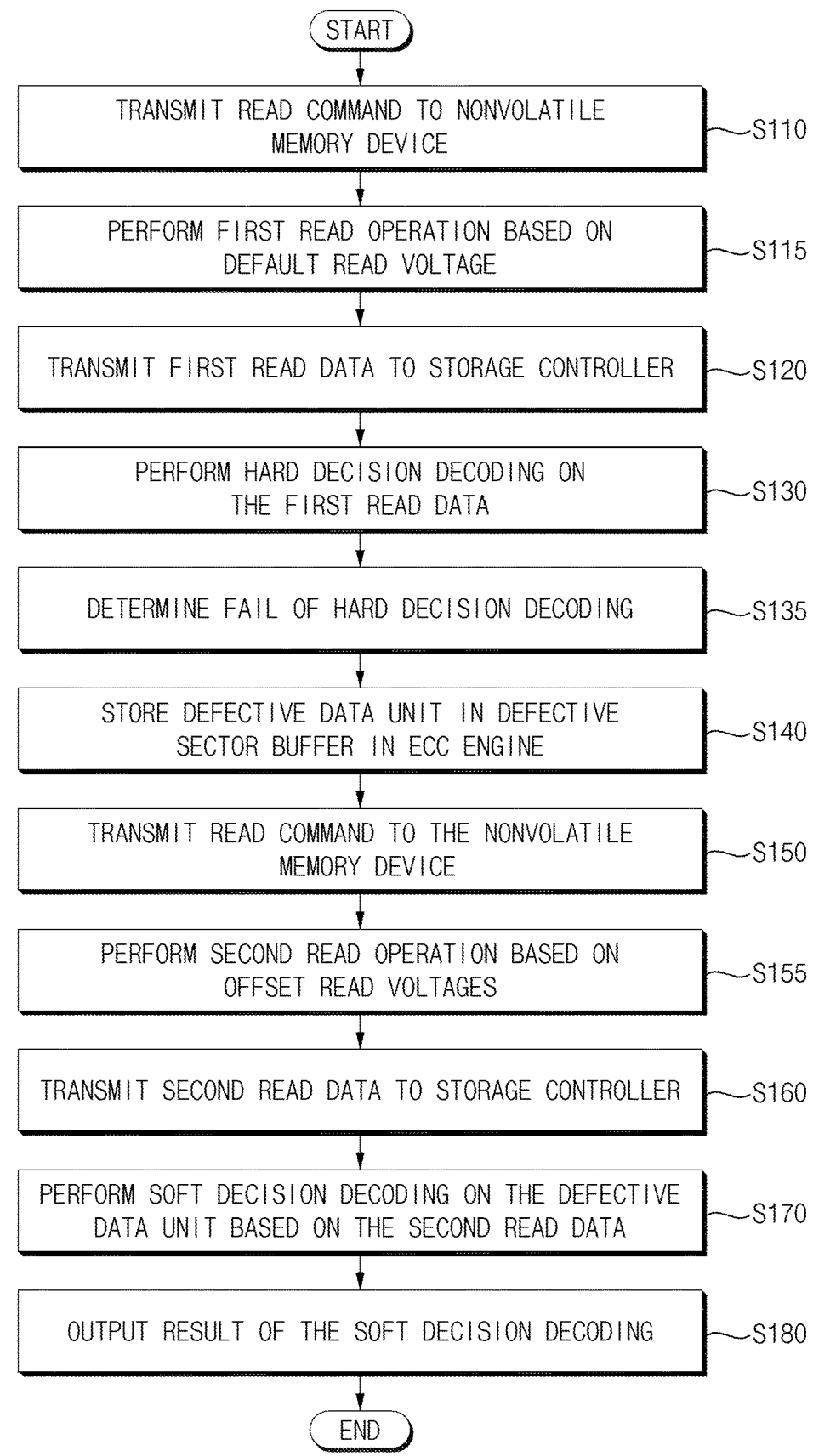

FIGS. 22 and 23 illustrate a method of operating a storage device according to example embodiments.

Referring to FIGS. 3, 15, 22 and 23, there is provided a method of operating a storage device 200 including a nonvolatile memory device 400a and a storage controller 300 to control the nonvolatile memory device 400a. According to the method, the storage controller 300 transmits a read command CMD to the nonvolatile memory device 400a (operation S110). The nonvolatile memory device 400a performs a first read operation on a plurality of sectors of a target page, based on a default read voltage, in response to the read command CMD (operation S115) and transmit a first read data including a plurality of data units HDRDs read from the plurality of sectors to the storage controller 300 (operation S120).

The ECC decoder 520 in the storage controller 300 sequentially performs a first ECC decoding (hard decision decoding) on each of the plurality of data units HDRDs (operation S130). In this instance, it is determined that the first ECC decoding on one or more data units from among the plurality of data units HDRDs is failed (operation S135), therefore, the ECC decoder 520 stores a data unit having a minimum expected error count, from among the data units on which the first ECC decoding is failed in a defective sector buffer 535 as a defective data unit (operation S140).

The storage controller 300 transmits a read command CMD to the nonvolatile memory device 400a for reading a second read data from a selected sector corresponding to the defective data unit (operation S150). The nonvolatile memory device 400a performs a second read operation on the selected sector, based on offset read voltages, in response to the read command CMD (operation S155) and transmits a second read data SDRD from the selected sector to the storage controller 300 (operation S160).

The ECC decoder 520 performs a second ECC decoding (soft decision decoding) based on the data unit stored in the defective sector buffer 535 and the second read data SDRD (operation S170) and may output a result of the second ECC decoding (operation S180).

Figure 24:
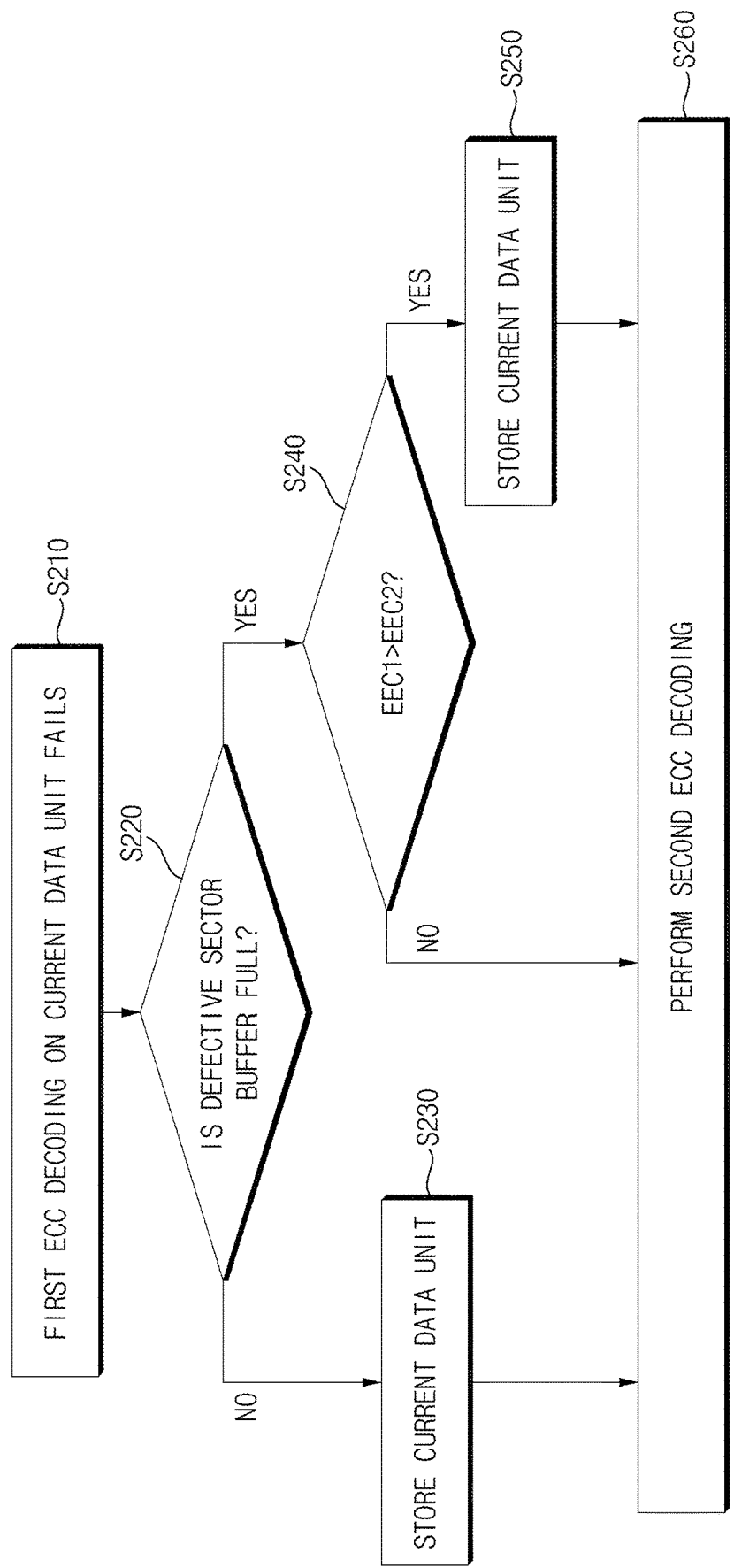
FIG. 24 is a flow chart illustrating an operation of the ECC decoder of FIG. 15 according to example embodiments.

FIG. 24 is a flow chart illustrating an operation of the ECC decoder of FIG. 15 according to example embodiments.

Referring to FIGS. 15 and 24, the main decoder 560 performs a first ECC decoding on each of the plurality of data units HDRDs and determines that the first ECC decoding on at least one data unit from among the plurality of data units HDRDs is failed (operation S210).

The buffer controller 540 checks whether the defective sector buffer 535 is full (operation S220). When the defective sector buffer 535 is not full (NO in S220), the buffer controller 540 stores a current data unit on which the first ECC decoding is failed in the defective sector buffer 535 (operation S230), and the main decoder 560 performs a second ECC decoding (operation S260).

When the defective sector buffer 535 is full (YES in S220), the buffer controller 540 determines when an expected error count EEC1 of a previous data unit that is pre-stored in the defective sector buffer 535 is greater than an expected error count EEC2 of the current data unit (operation S240).

When the expected error count EEC1 of the previous data unit is not greater than the expected error count EEC2 of the current data unit (NO in S240), the main decoder 560 performs a second ECC decoding (operation S260). When the expected error count EEC1 of the previous data unit is greater than the expected error count EEC2 of the current data unit (YES in S240), the buffer controller 540 stores the current data unit in the defective sector buffer (operation S250) and the main decoder 560 performs a second ECC decoding (operation S260).

Therefore, the ECC decoder, the storage controller and the storage device according to example embodiments may reduce a latency of soft decision decoding by storing a hard decision read data (defective read data) having a minimum expected error count in a defective sector buffer in the ECC decoder, from among one or more hard decision read data on which the hard decision decoding is failed, by receiving the defective read data from the defective sector buffer when the second ECC decoding is performed, by receiving a soft decision read data from a sector corresponding to the defective read data, by receiving a syndrome, stored while a hard decision decoding is being performed, from a syndrome buffer in the ECC decoder and by performing the soft decision decoding. In addition, the ECC decoder 520 may reduce a time interval associated with performing a second ECC decoding (soft decision decoding) because the ECC decoder 520 may skip the second ECC decoding on data units except the defective data unit stored in the defective sector buffer, from among the data units on which the first ECC decoding is failed.

Figure 25:
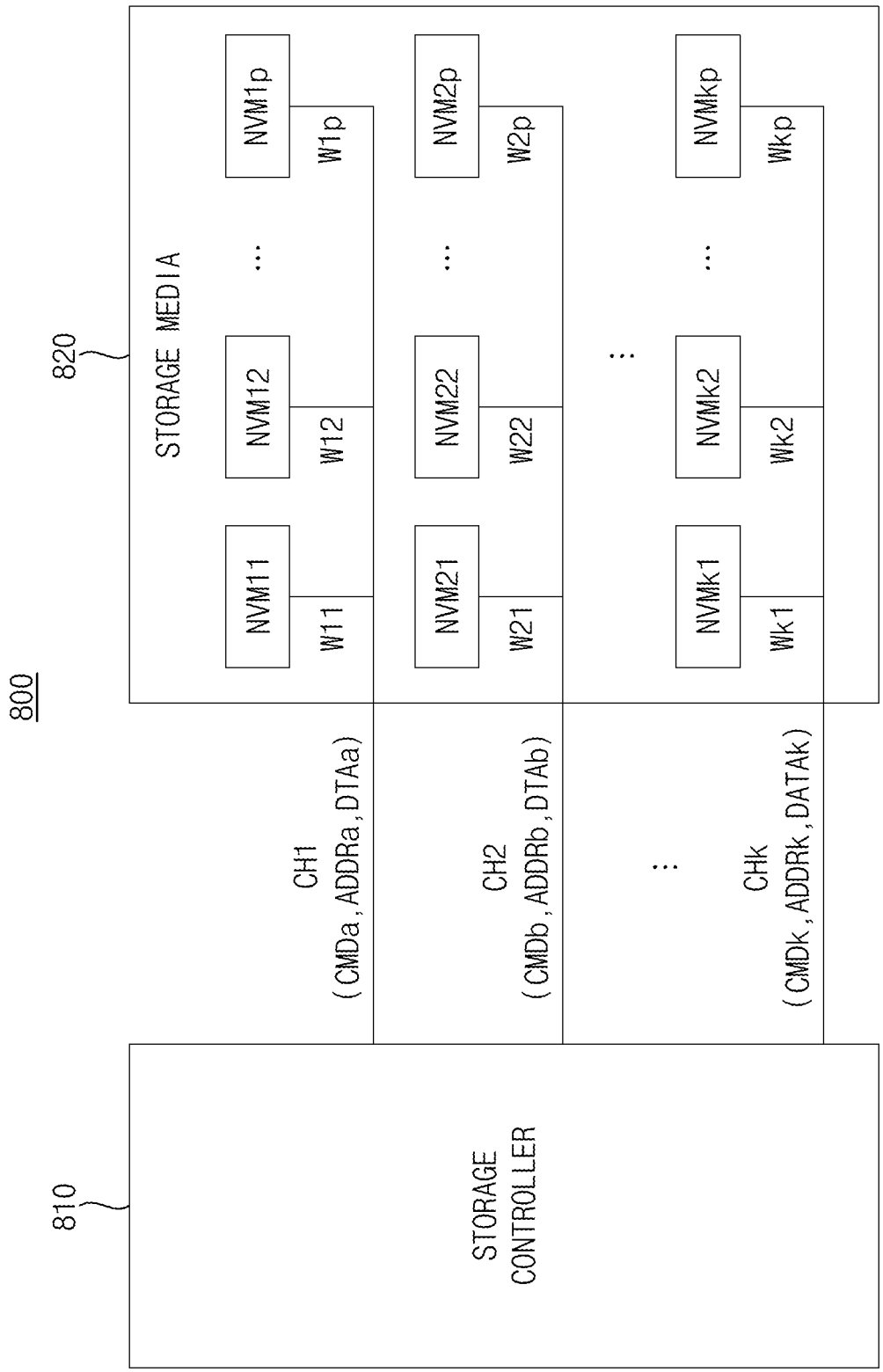
FIG. 25 is a block diagram illustrating a storage device according to example embodiments.

FIG. 25 is a block diagram illustrating a storage device according to example embodiments.

Referring to FIG. 25, a storage device 800 may include a storage controller 810 and a storage media 820. The storage device 800 may support a plurality of channels CH1, CH2, CHk, and the storage media 820 may be connected to the storage controller 810 through the plurality of channels CH1 to CHk.

The storage media 820 may include a plurality of nonvolatile memory devices NVM11, NVM12, . . . , NVM1p, NVM21, NVM22, . . . , NVM2p, NVMk1, NVMk2, . . . , NVMkp. For example, the nonvolatile memory devices NVM11 to NVMkp may correspond to the nonvolatile memory devices 400a~400k in FIG. 1. Each of the nonvolatile memory devices NVM11 to NVMkp may be connected to one of the plurality of channels CH1 to CHk through a connection path corresponding thereto. For instance, the nonvolatile memory devices NVM11 to NVMlp may be connected to the first channel CH1 through connection paths W11, W12, . . . , W1p, the nonvolatile memory devices NVM21 to NVM2p may be connected to the second channel CH2 through connection paths W21, W22, . . . , W2p, and the nonvolatile memory devices NVMk1 to NVMkp may be connected to the k-th channel CHk through connection paths Wk1, Wk2, . . . , Wkp. In some example embodiments, each of the nonvolatile memory devices NVM11 to NVMkp may be implemented as an arbitrary memory unit that may operate according to an individual command from the storage controller 810. For example, each of the nonvolatile memory devices NVM11 to NVMkp may be implemented as a chip or a die, but example embodiments are not limited thereto. The storage controller 810 may transmit and receive signals to and from the storage media 820 through the plurality of channels CH1 to CHk. For example, the storage controller 810 may correspond to the storage controller 300 in FIG. 1. For example, the storage controller 810 may transmit commands CMDa, CMDb, . . . , CMDk, addresses ADDRa, ADDRb, . . . , ADDRk and data DTAa, DTAb, . . . , DTAk to the storage media 820 through the channels CH1 to CHk or may receive the DTAa to DTAk from the storage media 820 through the channels CH1 to CHk.

The storage controller 810 may select one of the nonvolatile memories NVM11 to NVMks, which is connected to each of the channels CH1 to CHk, by using a corresponding one of the channels CH1 to CHk, and may transmit and receive signals to and from the selected nonvolatile memory device. For example, the storage controller 810 may select the nonvolatile memory NVM11 from among the nonvolatile memories NVM11 to NVM1p connected to the first channel CH1. The storage controller 810 may transmit the command CMDa, the address ADDRa and the DTAa to the selected nonvolatile memory device NVM11 through the first channel CH1 or may receive the DTAa from the selected nonvolatile memory device NVM11.

The storage controller 810 may transmit and receive signals to and from the storage media 820 in parallel through different channels.

Figure 26:
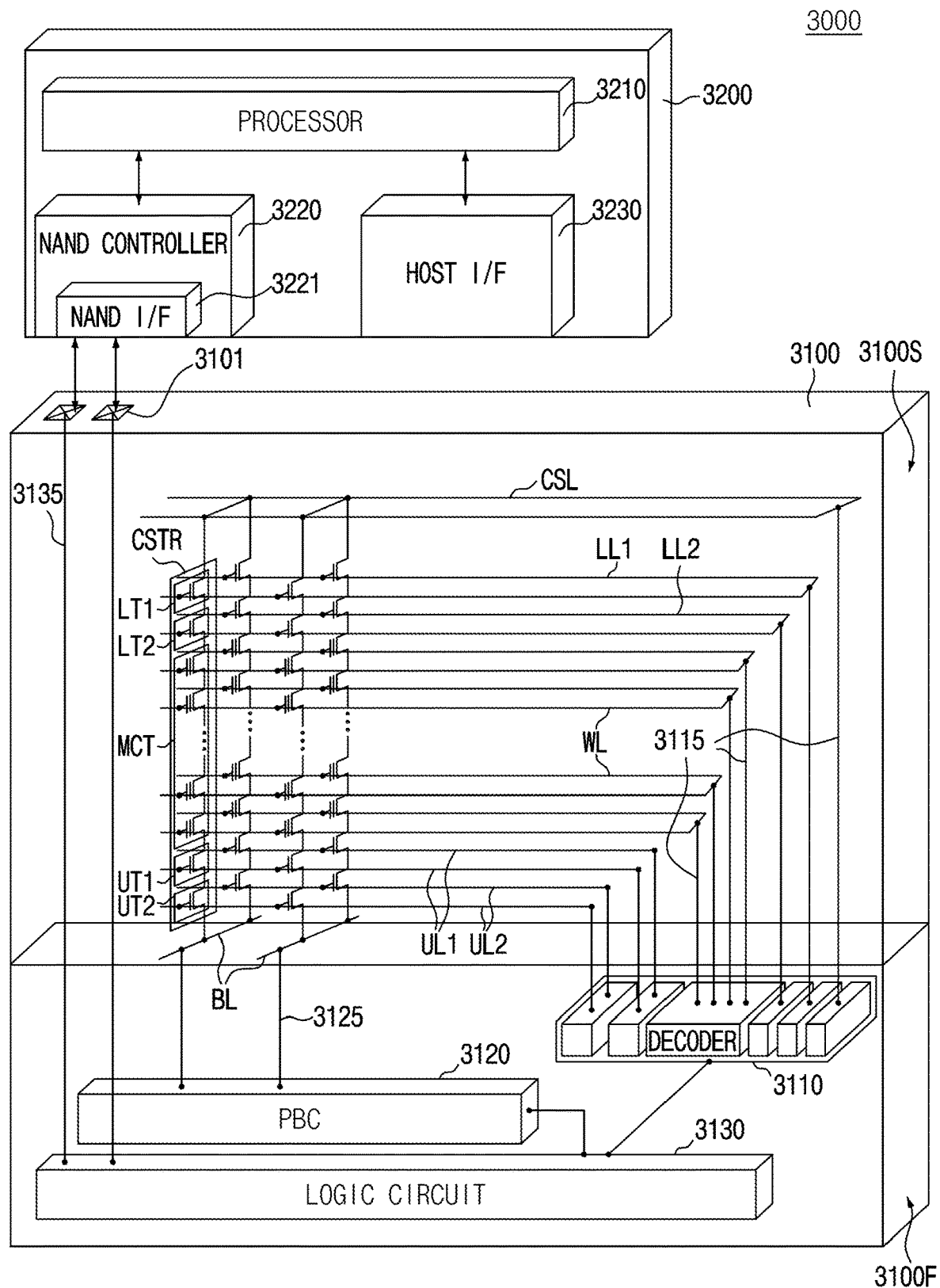
FIG. 26 is a block diagram illustrating an electronic system including a semiconductor device according to example embodiments.

FIG. 26 is a block diagram illustrating an electronic system including a semiconductor device according to example embodiments.

Referring to FIG. 26, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a non-volatile memory device, for example, a NAND flash memory device that is explained with reference to FIGS. 4 to 10. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and (memory) cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending from the second structure 3110S to the first structure 3100F. The bit-lines BL may be electrically connected to the page buffer circuit 3120 through second connection wirings 3125 extending from the second structure 3100S to the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

Figure 27:
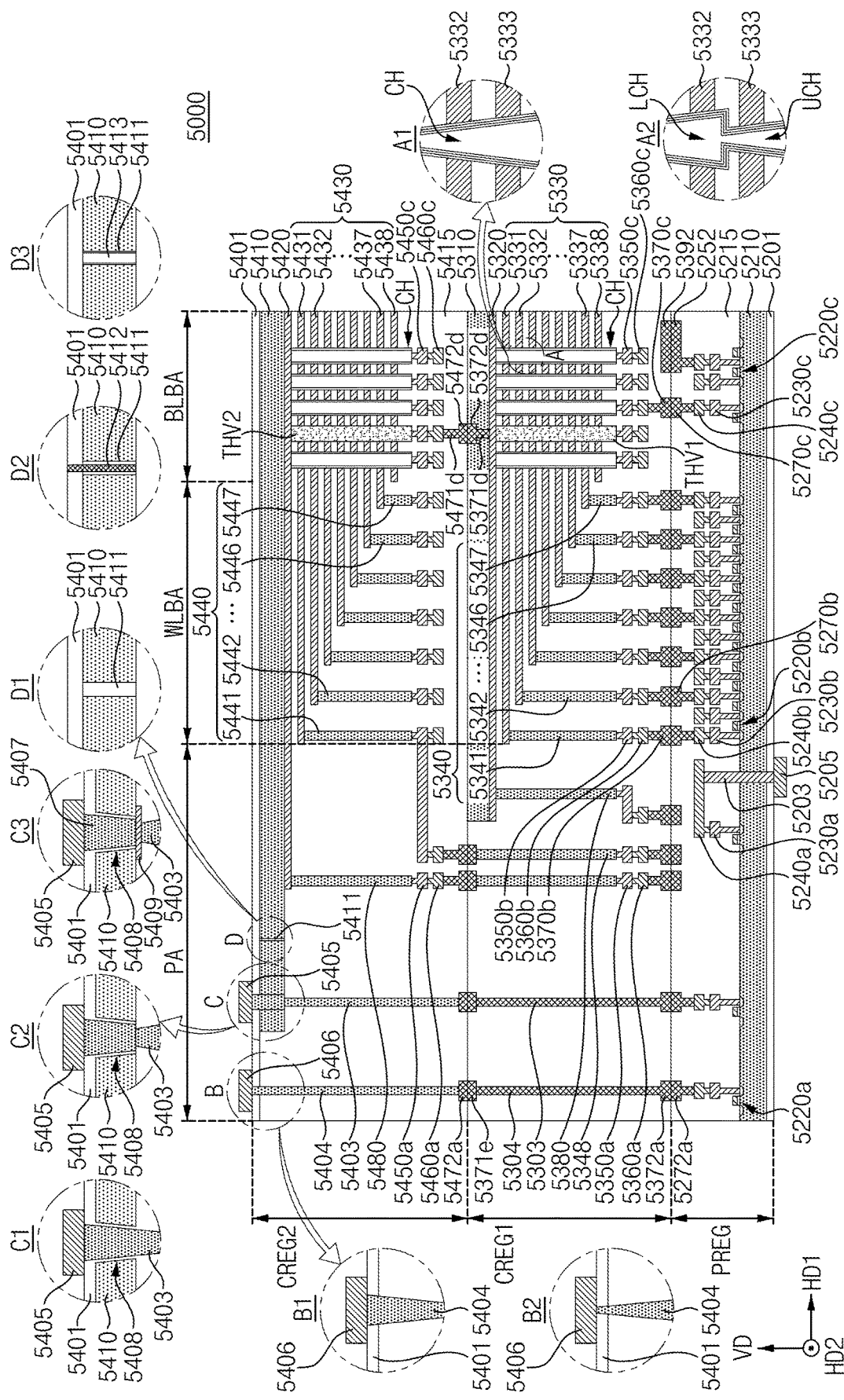
FIG. 27 is a cross-sectional view of a nonvolatile memory device according to example embodiments.

FIG. 27 is a cross-sectional view of a nonvolatile memory device according to example embodiments.

Referring to FIG. 27, a nonvolatile memory device 5000 (which will be referred to as a memory device, hereafter) may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 27, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +third direction VD, and the upper portion of each of the first and second upper chips may mean an upper portion defined based on a −third direction VD in FIG. 27. However, embodiments of the present disclosure are not limited thereto. In certain embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements 5220*a*, 5220*b* and 5220*c* formed on the first substrate 5210. An interlayer insulating layer 5215 including one or more insulating layers may be provided on the plurality of circuit elements 5220*a*, 5220*b* and 5220*c*, and a plurality of metal lines electrically connected to the plurality of circuit elements 5220*a*, 5220*b* and 5220*c* may be provided in the interlayer insulating layer 5215. For example, the plurality of metal lines may include first metal lines 5230*a*, 5230*b* and 5230*c* connected to the plurality of circuit elements 5220*a*, 5220*b* and 5220*c*, and second metal lines 5240*a*, 5240*b* and 5240*c* formed on the first metal lines 5230*a*, 5230*b* and 5230*c*. The plurality of metal lines may be formed of at least one of various conductive materials. For example, the first metal lines 5230*a*, 5230*b* and 5230*c* may be formed of tungsten having a relatively high electrical resistivity, and the second metal lines 5240*a*, 5240*b* and 5240*c* may be formed of copper having a relatively low electrical resistivity.

The first metal lines 5230*a*, 5230*b* and 5230*c* and the second metal lines 5240*a*, 5240*b* and 5240*c* are illustrated and described in the present embodiments. However, embodiments of the present disclosure are not limited thereto. In certain embodiments, at least one or more additional metal lines may further be formed on the second metal lines 5240*a*, 5240*b* and 5240*c*. In this case, the second metal lines 5240*a*, 5240*b* and 5240*c* may be formed of aluminum, and at least some of the additional metal lines formed on the second metal lines 5240*a*, 5240*b* and 5240*c* may be formed of copper having an electrical resistivity lower than that of aluminum of the second metal lines 5240*a*, 5240*b* and 5240*c*.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of word-lines 5330 (5331 to 5338) may be stacked on the second substrate 5310 in a direction (i.e., the third direction VD) perpendicular to a top surface of the second substrate 5310. String selection lines and a ground selection line may be disposed on and under the word-lines 5330, and the plurality of word-lines 5330 may be disposed between the string selection lines and the ground selection line. Likewise, the second cell region CREG2 may include a third substrate 5410 and a common source line 5420, and a plurality of word-lines 5430 (5431 to 5438) may be stacked on the third substrate 5410 in a direction (i.e., the third direction VD) perpendicular to a top surface of the third substrate 5410. Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some embodiments, as illustrated in a region 'A1', the channel structure CH may be provided in the bit-line bonding region BLBA and may extend in the direction perpendicular to the top surface of the second substrate 5310 (i.e., the third direction VD) to penetrate the word-lines 5330, the string selection lines, and the ground selection line. The channel structure CH may include a data storage layer, a channel layer, and a filling insulation layer. The channel layer may be electrically connected to a first metal line 5350*c* and a second metal line 5360*c* in the bit-line bonding region BLBA. For example, the second metal line 5360*c* may be a bit-line and may be connected to the channel structure CH through the first metal line 5350*c*. The bit-line 5360*c* may extend in a second direction HD2 parallel to the top surface of the second substrate 5310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 (i.e., the third direction VD) to penetrate the common source line 5320 and lower word-lines 5331 and 5332. The lower channel LCH may include a data storage layer, a channel layer, and a filling insulation layer and may be connected to the upper channel UCH. The upper channel UCH may penetrate upper word-lines 5333 to 5338. The upper channel UCH may include a data storage layer, a channel layer, and a filling insulation layer, and the channel layer of the upper channel UCH may be electrically connected to the first metal line 5350*c* and the second metal line 5360*c*. As a length of a channel increases, due to characteristics of manufacturing processes, it may be difficult to form a channel having a substantially uniform width. The memory device 5000 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word-line located near to a boundary between the lower channel LCH and the upper channel UCH may be a dummy word-line. For example, the word-lines 5332 and 5333 adjacent to the boundary between the lower channel LCH and the upper channel UCH may be the dummy word-lines. In this case, data may not be stored in memory cells connected to the dummy word-line. Alternatively, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it is possible to reduce an influence of a non-uniform channel width between the lower and upper channels LCH and UCH on an operation of the memory device.

Meanwhile, the number of the lower word-lines 5331 and 5332 penetrated by the lower channel LCH is less than the number of the upper word-lines 5333 to 5338 penetrated by the upper channel UCH in the region 'A2'. However, embodiments of the present disclosure are not limited thereto. In certain embodiments, the number of the lower word-lines penetrated by the lower channel LCH may be equal to or more than the number of the upper word-lines penetrated by the upper channel UCH. In addition, structural features and connection relation of the channel structure CH disposed in the second cell region CREG2 may be substantially the same as those of the channel structure CH disposed in the first cell region CREG1.

In the bit-line bonding region BLBA, a first through-electrode THV1 may be provided in the first cell region CREG1, and a second through-electrode THV2 may be provided in the second cell region CREG2. As illustrated in FIG. 27, the first through-electrode THV1 may penetrate the common source line 5320 and the plurality of word-lines 5330. In certain embodiments, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 5372*d* and a second through-metal pattern 5472*d*. The first through-metal pattern 5372*d* may be formed at a bottom end of the first upper chip including the first cell region CREG1, and the second through-metal pattern 5472*d* may be formed at a top end of the second upper chip including the second cell region CREG2. The first through-electrode THV1 may be electrically connected to the first metal line 5350*c* and the second metal line 5360*c*. A lower via 5371*d* may be formed between the first through-electrode THV1 and the first through-metal pattern 5372*d*, and an upper via 5471*d* may be formed between the second through-electrode THV2 and the second through-metal pattern 5472*d*. The first through-metal pattern 5372*d* and the second through-metal pattern 5472*d* may be connected to each other by the bonding method.

In addition, in the bit-line bonding region BLBA, an upper metal pattern 5252 may be formed in an uppermost metal layer of the peripheral circuit region PER1, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bit-line bonding region BLBA, the bit-line 5360*c* may be electrically connected to a page buffer included in the peripheral circuit region PER1. For example, some of the circuit elements 5220*c* of the peripheral circuit region PREG may constitute the page buffer, and the bit-line 5360*c* may be electrically connected to the circuit elements 5220*c* constituting the page buffer through an upper bonding metal pattern 5370*c* of the first cell region CREG1 and an upper bonding metal pattern 5270*c* of the peripheral circuit region PER1.

Referring to FIG. 27, in the word-line bonding region WLBA, the word-lines 5330 of the first cell region CREG1 may extend in a first direction HD1 parallel to the top surface of the second substrate 5310 and may be connected to a plurality of cell contact plugs 5340 (5341 to 5347). First metal lines 5350*b* and second metal lines 5360*b* may be sequentially connected onto the cell contact plugs 5340 connected to the word-lines 5330. In the word-line bonding region WLBA, the cell contact plugs 5340 may be connected to the peripheral circuit region PREG through upper bonding metal patterns 5370*b* of the first cell region CREG1 and upper bonding metal patterns 5270*b* of the peripheral circuit region PER1.

The cell contact plugs 5340 may be electrically connected to a row decoder included in the peripheral circuit region PER1. For example, some of the circuit elements 5220*b* of the peripheral circuit region PREG may constitute the row decoder, and the cell contact plugs 5340 may be electrically connected to the circuit elements 5220*b* constituting the row decoder through the upper bonding metal patterns 5370*b* of the first cell region CREG1 and the upper bonding metal patterns 5270*b* of the peripheral circuit region PER1. In some embodiments, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the word-line bonding region WLBA, the word-lines 5430 of the second cell region CREG2 may extend in the first direction HD1 parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the word-line bonding region WLBA, the upper bonding metal patterns 5370*b* may be formed in the first cell region CREG1, and the upper bonding metal patterns 5270*b* may be formed in the peripheral circuit region PER1. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other by the bonding method in the external pad bonding region PA. Likewise, an upper metal pattern 5372*a* may be formed in an upper portion of the first cell region CREG1, and an upper metal pattern 5272*a* may be formed in an upper portion of the peripheral circuit region PER1. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output pads 5205, 5405 and 5406 may be disposed in the external pad bonding region PA. Referring to FIG. 27, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220*a* disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220*a* disposed in the peripheral circuit region PREG through second input/output contact plugs 5403 and 5303, and the third input/output pad 5406 may be connected to at least one of the plurality of circuit elements 5220*a* disposed in the peripheral circuit region PREG through third input/output contact plugs 5404 and 5304.

In some embodiments, the third substrate 5410 may not be disposed in a region in which the input/output contact plug is disposed. For example, as illustrated in a region 'B', the third input/output contact plug 5404 may be separated from the third substrate 5410 in a direction parallel to the top surface of the third substrate 5410 and may penetrate an interlayer insulating layer 5415 of the second cell region CREG2 so as to be connected to the third input/output pad 5406. In this case, the third input/output contact plug 5404 may be formed by at least one of various processes.

In some embodiments, as illustrated in a region 'B1', the third input/output contact plug 5404 may extend in the third direction VD, and a diameter of the third input/output contact plug 5404 may become progressively greater toward the upper insulating layer 5401. In other words, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In certain embodiments, as illustrated in a region 'B2', the third input/output contact plug 5404 may extend in the third direction VD, and a diameter of the third input/output contact plug 5404 may become progressively less toward the upper insulating layer 5401. In other words, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In certain embodiments, the input/output contact plug may overlap with the third substrate 5410. For example, as illustrated in a region 'C', the second input/output contact plug 5403 may penetrate the interlayer insulating layer 5415 of the second cell region CREG2 in the third direction VD and may be electrically connected to the second input/output pad 5405 through the third substrate 5410. In this case, a connection structure of the second input/output contact plug 5403 and the second input/output pad 5405 may be realized by various methods.

In some embodiments, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, embodiments of the present disclosure are not limited thereto, and in certain embodiments, the diameter of the second input/output contact plug 5403 may become progressively less toward the second input/output pad 5405.

In certain embodiments, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In certain embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively, the stopper 5409 may be a metal line formed in the same layer as at least one of the word-lines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371e or may become progressively greater toward the lower metal pattern 5371e.

Meanwhile, in some embodiments, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some embodiments, as illustrated in a region 'D1', the slit 5411 may be formed to penetrate the third substrate 5410. For example, the slit 5411 may be used to prevent the third substrate 5410 from being finely cracked when the opening 5408 is formed. However, embodiments of the present disclosure are not limited thereto, and in certain embodiments, the slit 5411 may be formed to have a depth ranging from about 60% to about 70% of a thickness of the third substrate 5410.

In certain embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In certain embodiments, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the word-line bonding region WLBA. Since the insulating material 5413 is formed in the slit 5411, it is possible to prevent a voltage provided through the second input/output pad 5405 from affecting a metal layer disposed on the third substrate 5410 in the word-line bonding region WLBA.

Meanwhile, in certain embodiments, the first to third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some embodiments, at least one of the second substrate 5310 of the first cell region CREG1 or the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

Figure 28:
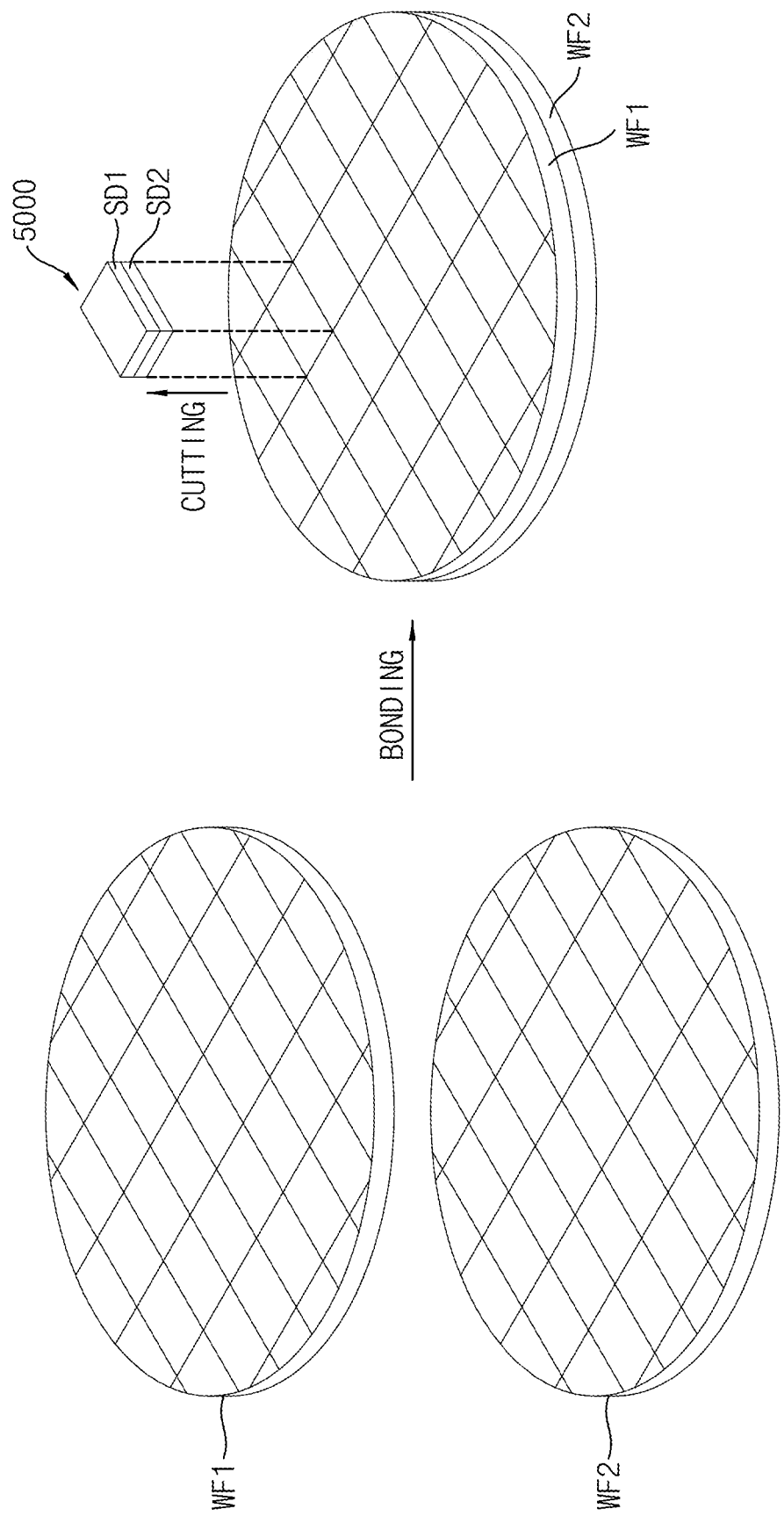
FIG. 28 is a conceptual diagram illustrating manufacturing processes of a stacked semiconductor device according to example embodiments.

FIG. 28 is a conceptual diagram illustrating manufacturing processes of a stacked semiconductor device according to example embodiments.

Referring to FIG. 28, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 5000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

The present disclosure may be applied to various electronic devices including a storage device. For example, example embodiments may be applied to systems such as a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IOT) device, an Internet of Everything (IoE) device, an e-book, a virtual reality (VR) device, an augmented reality (AR) device, a server system, an automotive driving system, etc.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. An error correction code (ECC) decoder comprising:
    an input manager configured to sequentially receive a first read data including a plurality of data units read from a plurality of sectors in a memory cell array of a nonvolatile memory device, by unit of sector;
    a pre-decoder configured to sequentially receive the first read data by unit of sector, in parallel with the input manager receiving the first read data and configured to generate a respective syndrome of each of the plurality of data units sequentially; and
    a main decoder configured to sequentially perform a first ECC decoding on the first read data based on the respective syndrome, by unit of sector,
    wherein, the input manager includes a defective sector buffer and is configured to:
        in response to the first ECC decoding on a first data unit of the plurality of data units being failed, store the first data unit in the defective sector buffer; and
        in response to the first ECC decoding on a second data unit of the plurality of data units being failed, selectively store the second data unit in the defective sector buffer based on an expected error count of each of the first data unit and the second data unit, and
    wherein the main decoder is configured to perform a second ECC decoding on a defective data unit stored in the defective sector buffer and receive a second read data from a selected sector corresponding to the defective data unit, from among the plurality of sectors.

2. The ECC decoder of claim 1, wherein:
    each of the plurality of data units corresponds to a hard decision data that is read from each of the plurality of sectors based on a default read voltage; and
    the second read data corresponds to a soft decision data that is read from the selected sector based on offset read voltages that have an offset with respect to the default read voltage.

3. The ECC decoder of claim 1,
    wherein the main decoder is configured to provide a first expected error count associated with the first data unit and a second expected error count associated with the second data unit to the input manager, the first expected error count and the second expected error count being generated during the first ECC decoding on each of the first data unit and the second data unit; and
    wherein the input manager further includes a buffer controller configured to selectively update the second data unit in the defective sector buffer based on a comparison of the first expected error count and the second expected error count.

4. The ECC decoder of claim 3, wherein, in response to the second expected error count being smaller than the first expected error count, the buffer controller is configured to update the second data unit in the defective sector buffer.

5. The ECC decoder of claim 3, wherein, in response to the second expected error count being equal to or greater than the first expected error count, the buffer controller is configured to maintain the first data unit in the defective sector buffer.

6. The ECC decoder of claim 3, wherein the input manager further comprises:
    a first sector buffer configured to store the plurality of data units sequentially;
    a second sector buffer configured to store the second read data,
    wherein the buffer controller comprises:
        a register configured to store the first expected error count and the second expected error count;
        a comparator configured to generate a comparison signal by comparing the first expected error count and the second expected error count stored in the register; and
        a control logic connected to the defective sector buffer and the first sector buffer, and configured to control an updating operation of the defective sector buffer based on the comparison signal.

7. The ECC decoder of claim 3, further comprising:
    an output manager connected to the main decoder,
    wherein the input manager further comprises:
        a buffer controller configured to selectively update the second data unit in the defective sector buffer based on a comparison of the first expected error count and the second expected error count;
        a first sector buffer configured to store the plurality of data units sequentially; and
        a second sector buffer configured to store the second read data,
    wherein the pre-decoder comprises:
        a syndrome calculator configured to generate syndromes of the plurality of data units sequentially; and
        a syndrome buffer configured to store a first syndrome associated with the first data unit and configured to selectively update a second syndrome associated with the second data unit in response to the second data unit being selectively updated in the defective sector buffer.

8. The ECC decoder of claim 1,
    wherein the main decoder is configured to provide a first expected error count associated with the first data unit and a second expected error count associated with the second data unit to the input manager, the first expected error count and the second expected error count being generated during the first ECC decoding on each of the first data unit and the second data unit; and
    wherein the pre-decoder comprises:
        a syndrome calculator configured to generate the syndrome of each of the plurality of data units sequentially; and
        a syndrome buffer connected to the syndrome calculator.

9. The ECC decoder of claim 8, wherein the syndrome buffer is configured to:
    store a first syndrome associated with the first data unit; and
    selectively update a second syndrome associated with the second data unit in response to the second data unit being selectively updated in the defective sector buffer.

10. The ECC decoder of claim 9, wherein the main decoder is configured to:
    generate a first syndrome weight based on the first syndrome associated with the first data unit;
    generate a second syndrome weight based on the second syndrome associated with the second data unit; and provide the input manager with the first syndrome weight and the second syndrome weight as the first expected error count and the second expected error count, respectively, and wherein each of the first syndrome weight and the second syndrome weight indicates a number of bits having a first logic level in each of the first syndrome and the second syndrome in a plurality of iterations of the first ECC decoding on each of the first data unit and the second data unit.

11. The ECC decoder of claim 1, wherein the main decoder is configured to provide a first expected error count associated with the first data unit and a second expected error count associated with the second data unit to the input manager, the first expected error count and the second expected error count being generated during the first ECC decoding on each of the first data unit and the second data unit; and wherein the main decoder comprises:
log likelihood ratio (LLR) mapper configured to output LLR data by mapping LLR values to the plurality of data units in the first ECC decoding and mapping the LLR values to the second read data in the second ECC decoding;
a variable node processor including variable nodes, the variable node processor configured to store the LLR data to provide the LLR data to a first switch network as a variable node message;
a check node processor connected to the first switch network and including check nodes, the check node processor configured to process a value of each of the variable nodes with respect to each of the check nodes, by referring to the variable node message and the syndromes, to provide the processed value to a second switch network as a check node message.

12. The ECC decoder of claim 11, wherein the variable node processor is configured to:
update the values of the variable nodes by referring to the check node message and is configured to perform the first ECC decoding and the second ECC decoding on the LLR data based on the updated values of the variable nodes; and
provide the input manager with the updated values of the variable nodes associated with each of the first data unit and the second data unit as the first expected error count and the second expected error count, respectively.

13. The ECC decoder of claim 11, wherein the check node processor is configured to:
generate a first syndrome weight based on the first syndrome associated with the first data unit;
generate a second syndrome weight based on the second syndrome associated with the second data unit; and
provide the input manager with the first syndrome weight and the second syndrome weight as the first expected error count and the second expected error count, respectively,
wherein each of the first syndrome weight and the second syndrome weight indicates a number of bits having a first logic level in each of the first syndrome and the second syndrome in a plurality of iterations of the first ECC decoding on each of the first data unit and the second data unit, and
wherein the check node processor is configured to update the values of the variable nodes based on a syndrome which is generated during the first ECC decoding and is updated in a syndrome buffer in the pre-decoder when the main decoder performs the second ECC decoding.

14. The ECC decoder of claim 11, wherein the main decoder is configured to perform the second ECC decoding based on the defective data unit stored in the defective sector buffer and the second read data read from the nonvolatile memory device.

15. The ECC decoder of claim 11, further comprising:
an output manager connected to the variable node processor, and
wherein the output manager is configured to output a decoded data or a read error message based on a result of the second ECC decoding.

16. A storage controller configured to control a nonvolatile memory device, the storage controller comprising:
an error correction code (ECC) decoder; and
a processor configured to control the ECC decoder,
wherein the ECC decoder is configured to:
sequentially receive a first read data including a plurality of data units read from a plurality of sectors in a memory cell array of a nonvolatile memory device, by unit of sector;
sequentially perform a first ECC decoding on the first read data by unit of sector;
in response to the first ECC decoding on a first data unit of the plurality of data units being failed, store the first data unit in a defective sector buffer therein;
in response to the first ECC decoding on a second data unit of the plurality of data units being failed, selectively store the second data unit in the defective sector buffer based on an expected error count of each of the first data unit and the second data unit; and
perform a second ECC decoding on a defective data unit stored in the defective sector buffer and receive a second read data from a selected sector corresponding to the defective data unit, from among the plurality of sectors.

17. The storage controller of claim 16,
wherein each of the plurality of data units corresponds to a hard-decision data that is read from each of the plurality of sectors based on a default read voltage,
wherein the second read data corresponds to a soft-decision data that is read from the selected sector based on offset read voltages that have an offset with respect to the default read voltage,
wherein the ECC decoder comprises:
an input manager configured to receive the first read data sequentially by unit of sector;
a pre-decoder configured to receive the first read data sequentially by unit of sector, in parallel with the input manager receiving the first read data and configured to generate syndromes of the plurality of data units sequentially; and
a main decoder configured to perform the first ECC decoding the first read data based on the syndromes, sequentially by unit of sector and configured to perform the second ECC decoding on the second read data, and
wherein the input manager comprises:
the defective sector buffer; and
a buffer controller configured to selectively update the second data unit in the defective sector buffer based on a comparison of a first expected error count associated with the first data unit and a second expected error count associated with the second data unit.

18. The storage controller of claim 16, wherein the main decoder is configured to provide an intermediate data as the expected error count and the main decoder is configured to generate the intermediate data while performing the first ECC decoding on each of the first data unit and the second data unit.

19. A storage device comprising:
at least one nonvolatile memory device including a memory cell array, wherein the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks; and
a storage controller including an error correction code (ECC) decoder configured to:
sequentially receive a first read data including a plurality of data units read from a plurality of sectors in the memory cell array based on a default read voltage, by unit of sector;
sequentially perform a first ECC decoding on the first read data by unit of sector;
in response to the first ECC decoding on a first data unit of the plurality of data units being failed, store the first data unit in a defective sector buffer therein;
in response to the first ECC decoding on a second data unit of the plurality of data units being failed, selectively store the second data unit in the defective sector buffer based on an expected error count of each of the first data unit and the second data unit; and
perform a second ECC decoding on a defective data unit stored in the defective sector buffer and a second read data read from a selected sector corresponding to the defective data unit based on offset read voltages that have an offset with respect to the default read voltage, from among the plurality of sectors.

20. The storage device of claim 19, wherein the at least one nonvolatile memory device further comprises:
a voltage generator configured to generate word-line voltages based on control signals;
an address decoder coupled to the memory cell array through the plurality of word-lines, the address decoder configured to transfer the word-line voltages to the memory cell array based on a row address;
a page buffer circuit coupled to the memory cell array through a plurality of bit-lines, the page buffer circuit configured to store user data in the memory cell array; and
a control circuit configured to control the voltage generator, the address decoder and the page buffer circuit based on a command and an address received from the storage controller,
wherein the memory cell array includes the plurality of memory blocks, and
wherein at least one of the plurality of memory blocks includes a plurality of NAND strings, and each of the plurality of NAND strings includes a plurality of memory cells stacked in the vertical direction.

* * * * *